US012798626B2

(12) United States Patent
Torazawa

(10) Patent No.: US 12,798,626 B2
(45) Date of Patent: Nov. 17, 2026

(54) TRAVELING VEHICLE SYSTEM, UNITARY UNIT, AND GRID- PATTERNED TRACK

(71) Applicant: MURATA MACHINERY, LTD., Kyoto (JP)

(72) Inventor: Masayoshi Torazawa, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 478 days.

(21) Appl. No.: 18/288,234

(22) PCT Filed: May 13, 2022

(86) PCT No.: PCT/JP2022/020238
§ 371 (c)(1),
(2) Date: Oct. 25, 2023

(87) PCT Pub. No.: WO2022/255062
PCT Pub. Date: Dec. 8, 2022

(65) Prior Publication Data

US 2024/0217738 A1 Jul. 4, 2024

(30) Foreign Application Priority Data

Jun. 3, 2021 (JP) ................................ 2021-093833

(51) Int. Cl.
*B61B 3/02* (2006.01)
*B61B 13/00* (2006.01)
*H10P 72/30* (2026.01)

(52) U.S. Cl.
CPC ................ *B61B 3/02* (2013.01); *B61B 13/00* (2013.01); *B65G 2201/0297* (2013.01); *H10P 72/3218* (2026.01)

(58) Field of Classification Search
CPC .. B61B 3/00; B61B 3/02; B61B 13/00; B65G 2201/0297; B65G 49/07; B65G 1/0457;
(Continued)

(56) References Cited

U.S. PATENT DOCUMENTS

2019/0189488 A1* 6/2019 Ito ............................ B61B 3/02
2021/0162850 A1 6/2021 Ogo et al.
(Continued)

FOREIGN PATENT DOCUMENTS

WO 2020/031465 A1 2/2020
WO 2020/110522 A1 6/2020

OTHER PUBLICATIONS

Official Communication issued in corresponding European Patent Application No. 22815817.6 mailed on May 9, 2025, 6 pages.
(Continued)

*Primary Examiner* — S. Joseph Morano
*Assistant Examiner* — Heaven R Buffington
(74) *Attorney, Agent, or Firm* — Keating & Bennett, LLP

(57) ABSTRACT

A grid-patterned track includes a unitary unit corresponding to one cell of the grid. The unitary unit includes two first tracks extending along a first direction, two second tracks extending along a second direction, which is different from the first direction, four intersection tracks corresponding to intersections between extension lines of the two first tracks in the first direction and extension lines of the two second tracks in the second direction, and spaced apart from the first tracks and the second tracks, and a connection that connects each of the four intersection tracks with the first tracks and the second tracks. The grid-patterned track includes linked unitary units, and two of the four intersection tracks are continuous between two of the unitary units linked to each other.

6 Claims, 19 Drawing Sheets

(58) Field of Classification Search
CPC .......... H01P 72/00; H01P 72/30; H01P 72/32; H01P 72/3202; H01P 72/3208; H01P 72/3216; H01P 72/3221
USPC ...................................................... 104/89, 91
See application file for complete search history.

(56) References Cited

U.S. PATENT DOCUMENTS

| | | | |
|---|---|---|---|
| 2022/0013392 | A1 | 1/2022 | Ogo et al. |
| 2022/0032971 | A1 | 2/2022 | Ogo et al. |

OTHER PUBLICATIONS

Official Communication issued in International Patent Application No. PCT/JP2022/020238, mailed on Aug. 2, 2022.

* cited by examiner

TRAVELING VEHICLE SYSTEM, UNITARY UNIT, AND GRID- PATTERNED TRACK

BACKGROUND OF THE INVENTION

1. Field of the Invention

The present invention relates to a traveling vehicle system, a unitary unit, and a grid-patterned track.

2. Description of the Related Art

Conventionally, a traveling vehicle system is known in which a traveling vehicle travels on a track suspended from a ceiling or the like. International Publication No. 2020/110522 discloses a traveling vehicle system including a plurality of first tracks extending along a first direction, a plurality of second tracks extending along a second direction, which is different from the first direction, and connection tracks corresponding to the intersections of the first tracks and the second tracks.

SUMMARY OF THE INVENTION

In the conventional technique, since each track on which the traveling vehicle travels is a separate component, when suspending it from a ceiling, in some cases, the installation accuracy of each track may be reduced and complicated operations may be required to adjust the installation position. The conventional technique thus has a problem that installation of a suspended track is not easy.

Preferred embodiments of the present invention provide traveling vehicle systems, unitary units, and grid-patterned tracks that each facilitate installation of a suspended track.

A traveling vehicle system according to an aspect of a preferred embodiment of the present invention includes a grid-patterned track of a suspended type, and a traveling vehicle to travel on the grid-patterned track, wherein the grid-patterned track includes a unitary unit corresponding to one cell of a grid, the unitary unit includes two first tracks extending along a first direction, two second tracks extending along a second direction, which is different from the first direction, four intersection tracks corresponding to intersections between extension lines of the two first tracks in the first direction and extension lines of the two second tracks in the second direction, and spaced apart from each of the two first tracks and each of the two second tracks, and a connection that connects each of the four intersection tracks with each of the two first tracks and each of the two second tracks, and the grid-patterned track includes a plurality of the unitary units linked together, and two of the four intersection tracks are continuous between two of the unitary units linked to each other.

A unitary unit according to an aspect of a preferred embodiment of the present invention includes two first tracks extending along a first direction, two second tracks extending along a second direction, which is different from the first direction, four intersection tracks corresponding to intersections between extension lines of the two first tracks in the first direction and extension lines of the two second tracks in the second direction, and spaced apart from each of the two first tracks and each of the two second tracks, and a connection that connects each of the four intersection tracks with each of the two first tracks and each of the two second tracks.

A grid-patterned track according to an aspect of a preferred embodiment of the present invention is a grid-patterned track of a suspended type on which a traveling vehicle is able to travel, the grid-patterned track including, as one cell of a grid, a unitary unit including two first tracks extending along a first direction, two second tracks extending along a second direction, which is different from the first direction, four intersection tracks corresponding to intersections between extension lines of the two first tracks in the first direction and extension lines of the two second tracks in the second direction, and spaced apart from each of the two first tracks and each of the two second tracks, and a connection that connects each of the four intersection tracks with each of the two first tracks and each of the two second tracks, and the grid-patterned track including a plurality of the unitary units linked together, and two of the four intersection tracks are continuous between two of the unitary units linked to each other.

According to the traveling vehicle systems, the unitary units, and the grid-patterned tracks of aspects of preferred embodiments of the present invention, the grid-patterned track includes a plurality of unitary units linked together, where one unitary unit defines and functions as one cell of the grid-patterned track, and therefore, compared to the case of suspending each track from the ceiling or the like, it is easier to make the grid shape uniform, and installation of a suspended track is easier without the need for adjusting the installation position.

In a traveling vehicle system according to an aspect of a preferred embodiment of the present invention, the grid-patterned track may be such that one of two second tracks and one of another two second tracks are in contact with each other, between two of the unitary units linked in the first direction and one of two first tracks and one of another two first tracks are in contact with each other, between two of the unitary units linked in the second direction. According to such an aspect, the unitary units are in contact with each other on the track (not on a point thereof but on a line or plane thereof), and therefore, the positional relationship between the adjacent unitary units can be easily determined, and the influence on vibration that occurs when the traveling vehicle travels can be reduced. In the traveling vehicle system of the above aspect, the unitary unit may be linkable to another unitary unit at a position above or below each of the four intersection tracks. According to such an aspect, compared to the case of linking above or below the first track or the second track, more unitary units can be linked using a fewer number of members, so that the positional accuracy between the unitary units becomes high, and linking can be performed easily by reducing the time and effort required for linking.

In a traveling vehicle system according to an aspect of a preferred embodiment of the present invention, the traveling vehicle may include a travel wheel and a guide wheel, the unitary unit may include a guide surface to guide the guide wheel on each side surface of each of the two first tracks, each of the two second tracks, and each of the four intersection tracks, and the guide surface of each of the four intersection tracks may have a shape that does not come into contact with the guide wheel when the guide wheel turns as the traveling vehicle changes its traveling direction. According to such an aspect, it is possible to mitigate the impact caused by the guide wheel being drawn in when the guide wheel turns, and to reduce or prevent the positional deviation of the traveling vehicle caused by the impact.

The above other and elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
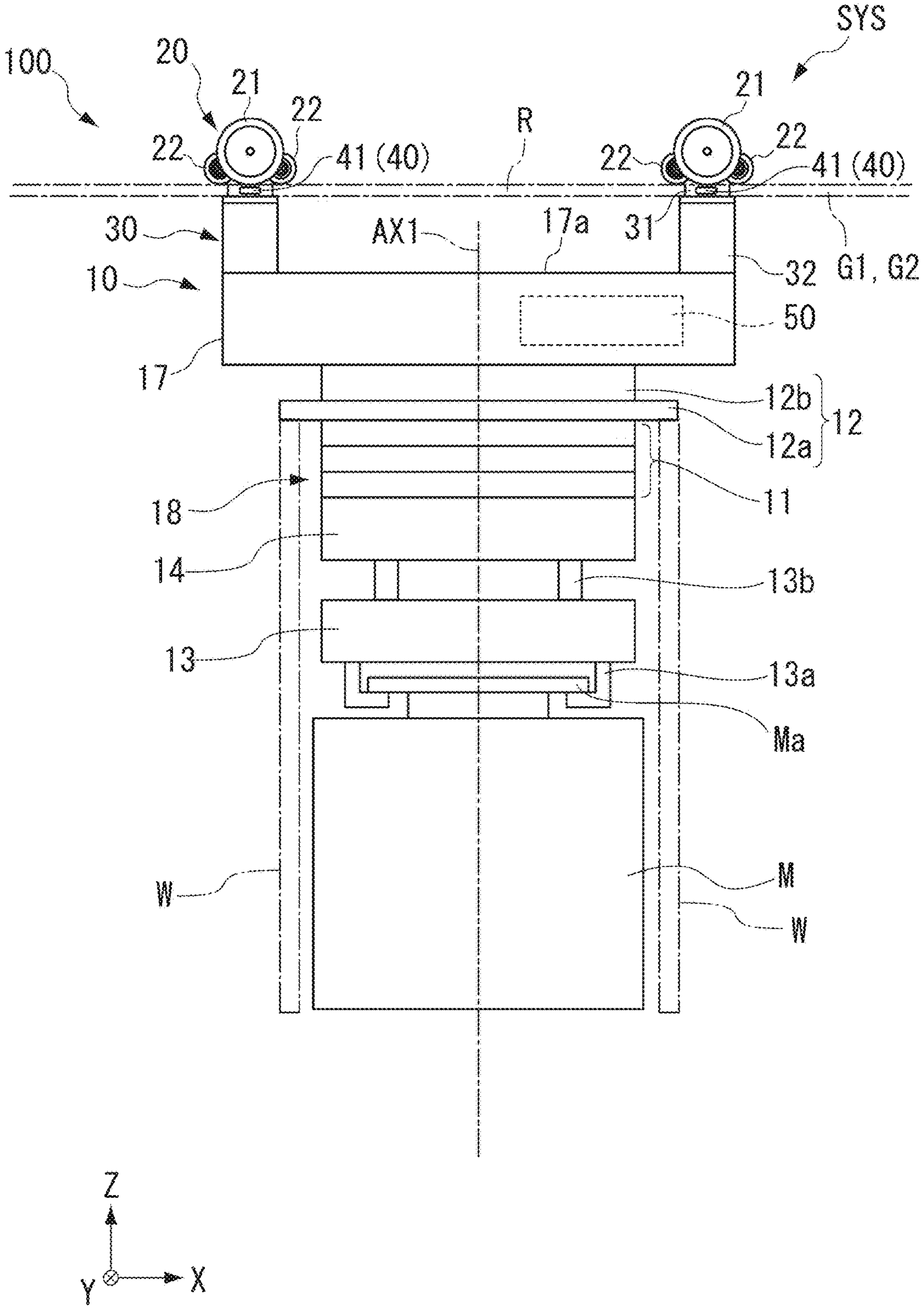
FIG. 1 is a side view showing an example of a traveling vehicle included in a traveling vehicle system according to a preferred embodiment of the present invention.

Hereunder, preferred embodiments will be described, with reference to the drawings. However, the present invention should not be considered as limited to the preferred embodiments described below. In the drawings, scale may be changed as necessary to illustrate the preferred embodiments, such as by enlarging, reducing or emphasizing a portion. In the drawings, an XYZ Cartesian coordinate system may be used to describe directions in each drawing. In the XYZ Cartesian coordinate system, the horizontal directions are taken as the X direction and the Y direction, and the vertical direction is taken as the Z direction. For each of the X direction, the Y direction, and the Z direction, description is made with a definition in which a direction indicated by an arrow is the positive (+) direction and a direction opposite to the direction indicated by the arrow is the negative (−) direction. Moreover, the turning direction around the vertical axis or the Z axis is referred to as θZ direction.

Figure 2:
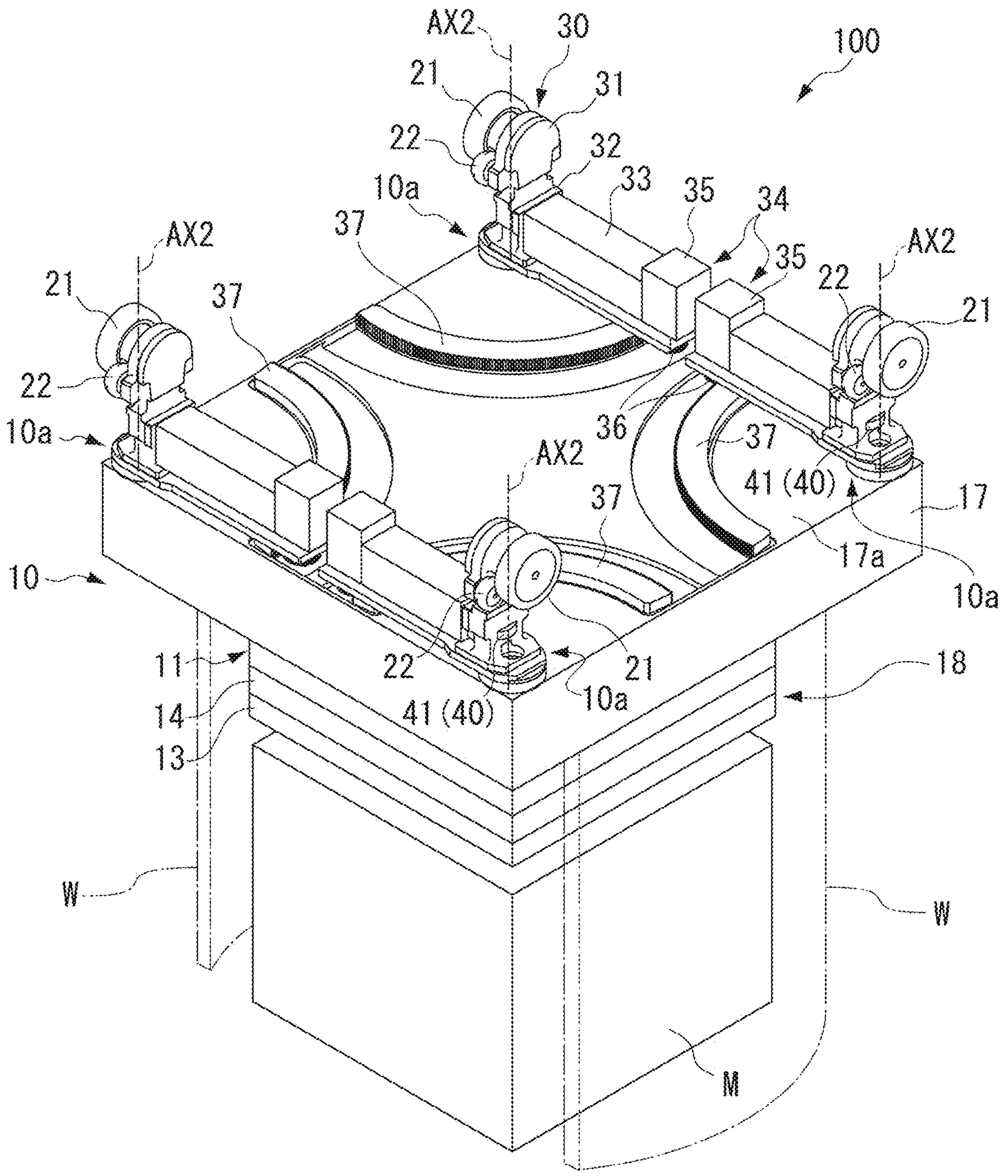
FIG. 2 is a perspective view showing an example of a traveling vehicle included in a traveling vehicle system according to a preferred embodiment of the present invention.
Figure 3:
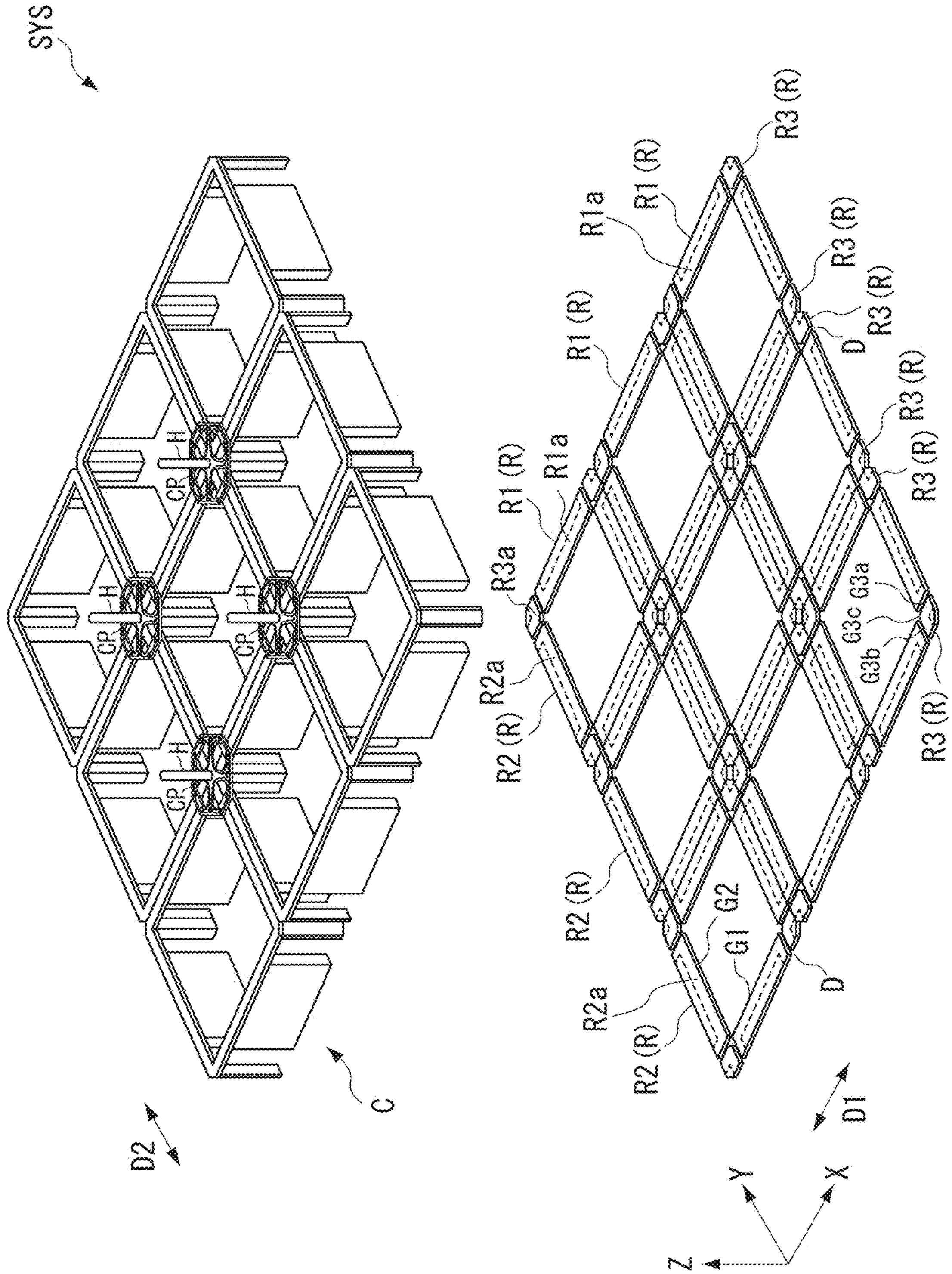
FIG. 3 is a perspective view showing an example of a grid-patterned track according to a preferred embodiment of the present invention.
Figure 4:
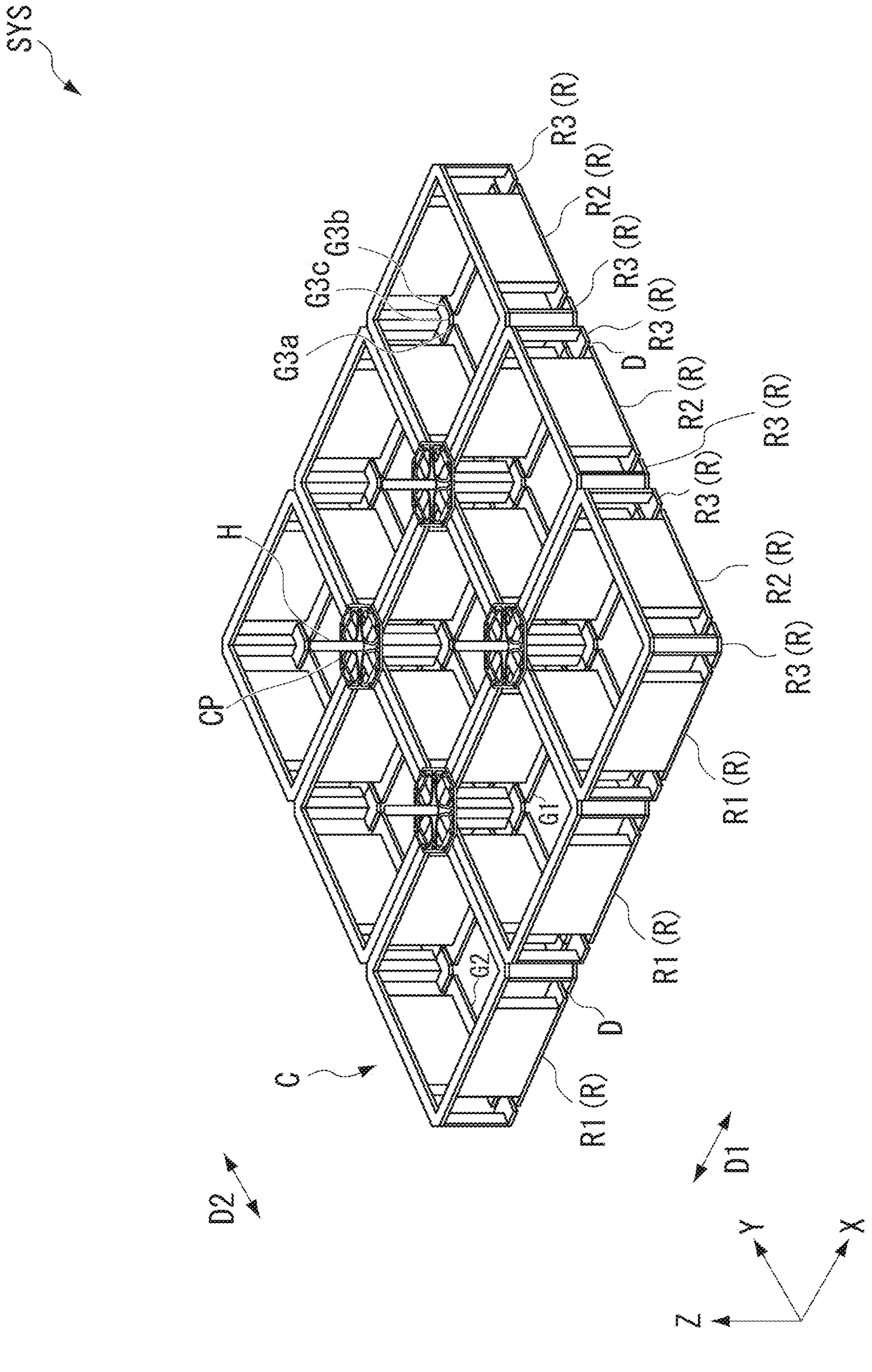
FIG. 4 is a perspective view showing an example of a grid-patterned track according to a preferred embodiment of the present invention.
Figure 5:
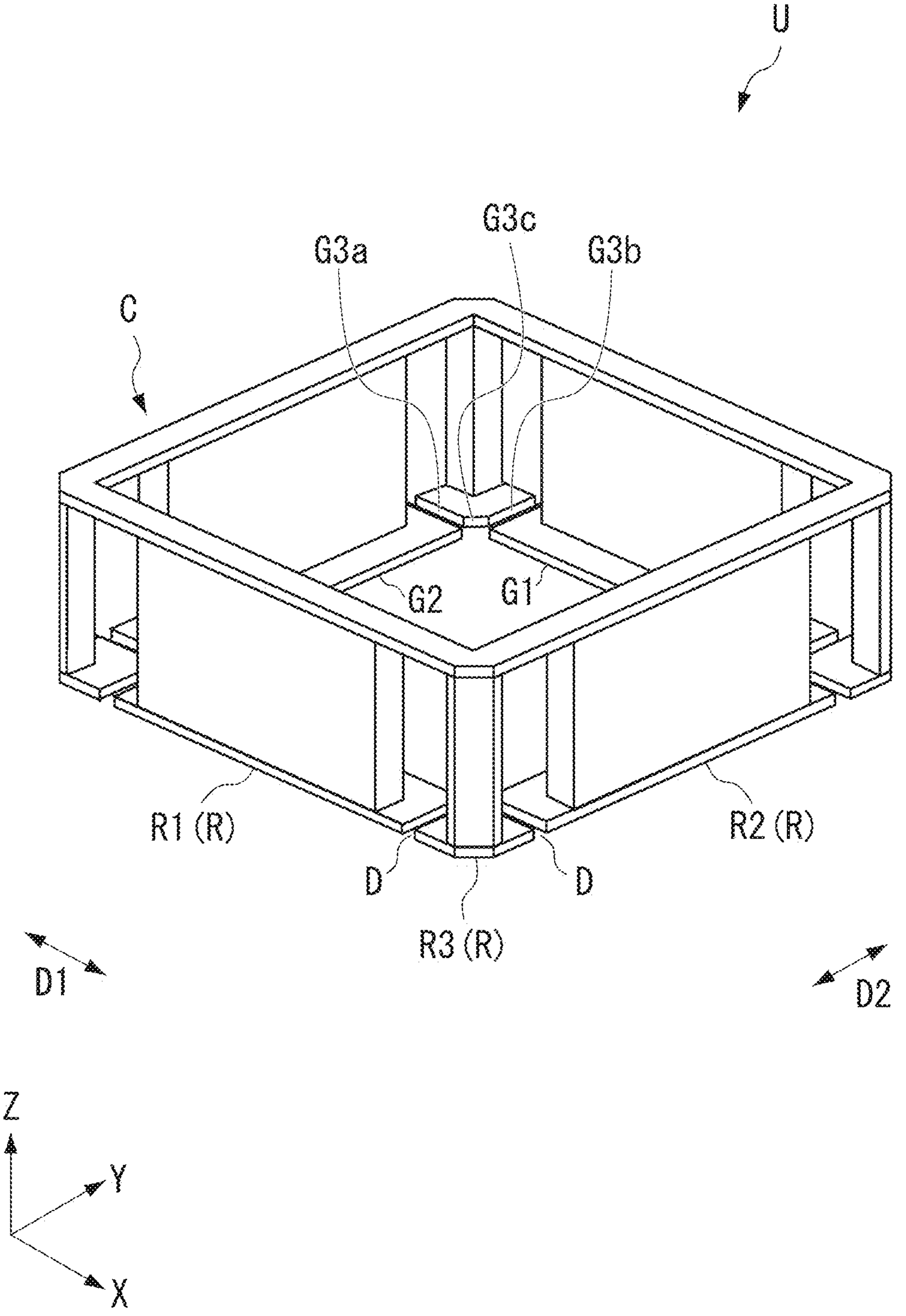
FIG. 5 is a perspective view showing an example of a unitary unit according to a preferred embodiment of the present invention.

FIG. 1 is a side view showing an example of a traveling vehicle included in a traveling vehicle system according to the present preferred embodiment. FIG. 2 is a perspective view showing an example of the traveling vehicle included in the traveling vehicle system according to the present preferred embodiment. FIG. 3 and FIG. 4 are perspective views showing an example of a grid-patterned track according to the present preferred embodiment. FIG. 5 is a perspective view showing an example of a unitary unit according to the present preferred embodiment. In FIG. 3, in order to facilitate the understanding of the description, an upper side including suspenders to suspend the grid-patterned track and connections and a lower side including the grid-patterned track are illustrated separately, and regions where the upper side and the lower side overlap are indicated by broken lines. A traveling vehicles 100 travels along a track R of a traveling vehicle system SYS and transports articles M such as FOUP (Front Opening Unified Pod) accommodating semiconductor wafers or reticle pod accommodating reticles.

The traveling vehicle system SYS is, for example, a system for transporting articles M by the traveling vehicle 100 in a clean room of a semiconductor manufacturing factory. In the traveling vehicle system SYS, a plurality of the traveling vehicles 100 may be used. Transporting articles M with a plurality of the traveling vehicles 100 enables high-density transportation and enables improved efficiency of transporting articles M.

The track R is a form of a track. The track R is a grid-patterned track of a suspended type installed on or in the vicinity of the ceiling of a building such as a clean room (see FIG. 3 and FIG. 4). Hereinafter, the track R may be referred to as grid-patterned track R. The grid-patterned track R includes a unitary unit U corresponding to one cell of the grid (see FIG. 5). The unitary unit U includes two first tracks R1 extending along a first direction D1, and two second tracks R2 extending along a second direction D2, which is different from the first direction D1. The unitary unit U also includes four intersection tracks R3 corresponding to the intersections between extension lines of the two first tracks R1 in the first direction D1 and extension lines of the two second tracks R2 in the second direction D2, and spaced apart from each of the two first tracks R1 and each of the two second tracks R2. The unitary unit U includes a connection C that connects each of the four intersection tracks R3 with each of the two first tracks R1 and each of the two second tracks R2. This "connection" means connecting tracks within the unitary unit U, and the "connection" is completed when the unitary unit U is completed. The grid-patterned track R is formed by linking a plurality of unitary units U, and two of the four intersection tracks R3 are continuous between two of the unitary units U linked to each other. This "connection" means connecting completed unitary units U to each other. This "continuous" also means that the tracks are in a positional relationship that allows the traveling vehicle 100 to travel through. In the present preferred embodiment, the first direction D1 and the second direction D2 are orthogonal to each other. That is to say, the first track R1 (an extension line of the first track R1 in the first direction D1) and the second track R2 (an extension line of the second track R2 in the second direction D2) are in a positional relationship so as to be orthogonal to each other. FIG. 3 and FIG. 4 show a portion of the grid-patterned track R. The grid-patterned track R may be formed in a manner such that configurations similar to that shown in the figure are arranged successively in the first direction D1 (X direction) and in the second direction D2 (Y direction).

The grid-patterned track R is such that one of two second tracks R2 and one of another two second tracks R2 are in contact with each other, between two of the unitary units U linked in the first direction D1. The grid-patterned track R is such that one of two first tracks R1 and one of another two first tracks R1 are in contact with each other, between two of the unitary units U linked in the second direction D2. The unitary unit U is linkable to another unitary unit U at a position above or below each of the four intersection tracks R3. Coupling members CP are used to link a plurality of unitary units U. A plurality of unitary units U and the coupling members CP that link the plurality of unitary units U are suspended by suspenders H from a ceiling or the like (not shown in the drawings).

The first track R1, the second track R2, and the intersection track R3 include a traveling surface R1*a*, a traveling surface R2*a*, and a traveling surface R3*a* respectively on which traveling wheels 21 (travel wheels) of the traveling vehicle 100 travel. A gap D is formed between the first track R1 and the intersection track R3 and between the second track R2 and the intersection track R3. The gap D is a portion through which a portion of the traveling vehicle 100 (for example, a coupler 30 described later) passes when the traveling vehicle 100 having traveled on the first track R1 crosses the second track R2 or when the traveling vehicle 100 having traveled on the second track R2 crosses the first track R1. Therefore, the gap D is provided with a width that allows the coupler 30 to pass therethrough. The first tracks R1, the second tracks R2, and the intersection tracks R3 are provided along the same or substantially the same horizontal plane. As a result, the traveling surfaces R1*a*, R2*a*, and R3*a* are arranged on the same or substantially the same horizontal plane.

The grid-patterned track R includes a first guide surface G1 and a second guide surface G2. In the unitary unit U, the first guide surface G1 is provided along each of the two first tracks R1. Specifically, in the unitary unit U, the first guide surface G1 is provided on a side surface of each of the two first tracks R1 and guides a guide roller 41 (guide wheel) described later. In the unitary unit U, the second guide surface G2 is provided along each of the two second tracks R2. Specifically, in the unitary unit U, the second guide surface G2 is provided on a side surface of each of the two second tracks R2 and guides the guide roller 41 described later.

The intersection track R3 includes a first connection guide surface G3*a*, a second connection guide surface G3*b*, and a non-contact surface G3*c*. Specifically, the first connection guide surface G3*a* is provided at the same or substantially the same height and in the same or substantially the same direction as the first guide surface G1, and guides the guide roller 41 described later. That is to say, the first connection guide surface G3*a* and the first guide surface G1 are included in the same plane. Similarly, the second connection guide surface G3*b* is provided at the same or substantially the same height and in the same or substantially the same direction as the second guide surface G2, and guides the guide roller 41 described later. That is to say, the second connection guide surface G3*b* and the second guide surface G2 are included in the same plane. The non-contact surface G3*c* is formed so as to be a continuation of both the first connection guide surface G3*a* and the second connection guide surface G3*b*. As will be described later, the non-contact surface G3*c* has a shape that does not come in contact with the guide roller 41 when the guide roller 41 turns as the traveling vehicle 100 changes its traveling direction. For example, the non-contact surface G3*c* is chamfered so as not to come in contact with the guide roller 41. Details of the first connection guide surface G3*a*, the second connection guide surface G3*b*, and the non-contact surface G3*c* of the intersection track R3 will be described later.

As shown in FIG. 1 and FIG. 2, the traveling vehicle 100 includes a main body 10, the travelers 20, the couplers 30, the guides 40, and a controller 50. The controller 50 is configured or programmed to comprehensively control respective portions, functions, and elements of the traveling vehicle 100. The controller 50 is provided in the main body 10 in this example here. However, the controller 50 may be provided outside the main body 10. The main body 10 is arranged below the grid-patterned track R (on the −Z side). The main body 10 is formed, for example, in a rectangular shape as seen in a plan view. The main body 10 is formed in a size that can be accommodated within the unitary unit U corresponding to one cell of the grid in the grid-patterned track R as seen in a plan view. Therefore, in the traveling vehicle system SYS, it is possible to ensure a space where a traveling vehicle 100 traveling in a predetermined unitary unit U and another traveling vehicle 100 traveling in a unitary unit U adjacent to the predetermined unit U pass one another. The main body 10 includes an upper unit 17 and a transferer 18. The upper unit 17 is suspended from the travelers 20 via the couplers 30. The upper unit 17 is, for example, of a rectangular shape as seen in a plan view, and has four corners 10*a* on the upper surfaces 17*a*.

The main body 10 includes a traveling wheel 21, a coupler 30, a direction changer 34, and a guide 40 at each of the four corners 10*a*. In this configuration, the traveling wheels 21 arranged at the four corners 10*a* of the main body 10 enable stable suspension of the main body 10 and stable traveling of the main body 10. The guides 40 arranged at the four corners 10*a* of the main body 10 can effectively reduce or prevent positional deviation of the main body 10 with respect to the grid-patterned track R in the first direction D1 or the second direction D2, and positional deviation of the main body 10 around the vertical axis with respect to the grid-patterned track R. The details of the guide 40 will be described later.

The transferer 18 is provided below the upper unit 17. The transferer 18 can rotate around the rotation axis AX1 along the Z direction (vertical direction). The transferer 18 includes an article holder 13 to hold an article M, a lift driver 14 to raise or lower the article holder 13 in the vertical direction, a lateral extender 11 to move the lift driver 14 in the horizontal direction, and a rotator 12 to hold the lateral extender 11. The article holder 13 grasps the flange Ma of the article M to thereby suspend and hold the article M. The article holder 13 is, for example, a chuck having claws 13*a* movable in the horizontal direction, and inserts the claws 13*a* under the flange Ma of the article M and raises the article holder 13, to thereby hold the article M. The article holder 13 is connected to suspenders 13*b* such as wires and belts.

The lift driver 14 is, for example, a hoist, and lowers the article holder 13 by feeding out suspenders 13*b* and raises the article holder 13 by taking up the suspenders 13*b*. The lift driver 14 is controlled by the controller 50 to raise or lower the article holder 13 at a predetermined speed. Also, the lift driver 14 is controlled by the controller 50 to maintain the article holder 13 at a target height.

The lateral extender 11 includes a plurality of movable plates arranged stacked, for example, in the Z direction. The movable plates can move relatively in the Y direction. The lift driver 14 is mounted on the lowermost movable plate. The lateral extender 11 can laterally extend (slide and move) the lift driver 14 and the article holder 13 mounted on the lowermost movable plate, for example, in the horizontal direction orthogonal to the traveling direction, by moving the movable plates by a driver not shown in the drawings.

The rotator 12 is provided between the lateral extender 11 and the upper unit 17. The rotator 12 includes a rotation member 12*a* and a rotation driver 12*b*. The rotation member 12*a* is provided so as to be rotatable in the axial direction around the vertical axis. The rotation member 12*a* supports the lateral extender 11. The rotation driver 12*b* uses, for example, an electric motor or the like, and causes the rotation member 12*a* to rotate in the axial direction around the rotation axis AX1. The rotator 12 can, by rotating the rotation member 12*a* by the driving force from the rotation driver 12*b*, rotate the lateral extender 11 (lift driver 14 and article holder 13) in the axial direction around the rotation axis AX1.

As shown in FIG. 1 and FIG. 2, a cover W may be provided so as to surround the transferer 18 and the article M held by the transferer 18. The cover W is of a cylindrical shape having an open-ended bottom, and is of a shape having a cutout portion through which the movable plates of the lateral extender 11 project. The upper end of the cover W is attached to the rotation member 12*a* of the rotator 12, and the cover W rotates axially around the rotation axis AX1 as the rotating member 12*a* rotates.

Each traveler 20 includes a traveling wheel 21 and auxiliary wheels 22. The traveling wheel 21 is arranged in each of the four corners 10*a* on the upper surface 17*a* of the upper unit 17 (main body 10). Each traveling wheel 21 is mounted on an axle 21*a* provided in the coupler 30. The axle 21*a* is provided in parallel or substantially parallel along the XY plane. Each traveling wheel 21 is driven to rotate by the driving force of a traveling driver 33, which will be described later. Each traveling wheel 21 rolls on the traveling surfaces R1*a*, R2*a*, and R3*a* of the first track R1, the second track R2, and the intersection track R3 of the grid-patterned track R, causing the traveling vehicle 100 to travel. The configuration is not limited to driving all of the four traveling wheels 21 to rotate by the drive force of the traveling driver 33, and some of the four traveling wheels 21 may be driven to rotate.

Each traveling wheel 21 is provided so as to be able to turn in the θZ direction around the turning axis AX2. The traveling wheel 21 is turned in the θZ direction by the direction changer 34 described later, and as a result, the traveling direction of the traveling vehicle 100 can be changed. The auxiliary wheels 22 are each arranged in the front and rear of the traveling wheel 21 in the traveling direction. As with the traveling wheel 21, each auxiliary wheel 22 can rotate axially around an axle 22*a*, which is parallel or substantially parallel along the XY plane. The lower end of the auxiliary wheel 22 is set higher than the lower end of the traveling wheel 21. Therefore, when the traveling wheel 21 is traveling on the traveling surfaces R1*a*, R2*a*, and R3*a*, the auxiliary wheels 22 do not come into contact with the traveling surfaces R1*a*, R2*a*, and R3*a*. When the traveling wheel 21 passes through the gap D, the auxiliary wheels 22 come into contact with the traveling surfaces R1*a*, R2*a*, and R3*a*, preventing the traveling wheel 21 from falling. The configuration is not limited to providing two auxiliary wheels 22 for a single traveling wheel 21, and for example, a single auxiliary wheel 22 may be provided for a single traveling wheel 21, or no auxiliary wheel 22 may be provided.

The coupler 30 couples the upper unit 17 of the main body 10 and the traveler 20. The coupler 30 is provided at each of the four corners 10*a* on the upper surface 17*a* of the upper unit 17 (main body 10). The main body 10 is suspended from the traveler 20 by the couplers 30 and is arranged below the grid-patterned track R. The coupler 30 includes a support member 31 and a connection member 32. The support member 31 rotatably supports the rotation axle of the traveling wheel 21 and the rotation axles of the auxiliary wheels 22. The support member 31 maintains the relative position between the traveling wheel 21 and the auxiliary wheels 22. The support member 31 is formed, for example, in a plate shape with a thickness that allows it to pass through the gap D.

The connection members 32 each extend downward from the support member 31 and is connected to the upper surface 17*a* of the upper unit 17 to hold the upper unit 17. The connection member 32 therein includes a transmission to transmit the driving force of the traveling driver 33 described later to the traveling wheel 21. This transmission may be of a configuration in which a chain or a belt is used, or a configuration in which a gear train is used. The connection member 32 is provided so as to be able to turn in the θZ direction around the turning axis AX2. The turning of the connection member 32 around the turning axis AX2 can cause the traveling wheel 21 to turn around the turning axis AX2 in the θZ direction via the support member 31.

The traveling driver 33 and the direction changer 34 are provided in the coupler 30. The traveling driver 33 is attached to the connection member 32. The traveling driver 33 is a drive source to drive the traveling wheel 21, and for example, an electric motor or the like is used therefor. Each of the four traveling wheels 21 is driven by the traveling driver 33 to serve as a driving wheel. The four traveling wheels 21 are controlled by the controller 50 so as to rotate at the same or substantially the same rotation speed. If any one of the four traveling wheels 21 is not used as a driving wheel, the traveling driver 33 is not attached to the connection member 32 corresponding to the traveling wheel 21 not used as a driving wheel.

The direction changer 34 causes the connection member 32 of the coupler 30 to turn around the turning axis AX2 to thereby cause the traveling wheel 21 to turn around the turning axis AX2 in the θZ direction. It is possible, by turning the traveling wheel 21 in the θZ direction, to switch from a first state where the traveling direction of the traveling vehicle 100 is the first direction D1 to a second state where the traveling direction is the second direction D2, or from the second state where the traveling direction is the second direction D2 to the first state where the traveling direction is the first direction D1.

The direction changer 34 includes a drive source 35, a pinion gear 36, and a rack 37. The drive source 35 is mounted on a side surface of the traveling driver 33 away from the turning axis AX2. As the drive source 35, for example, an electric motor or the like is used. The pinion gear 36 is mounted on the lower surface side of the drive source 35, and is driven to rotate in the OZ direction by the driving force generated by the drive source 35. The pinion gear 36 is of a circular shape as seen in a plan view and includes a plurality of teeth on the outer circumference thereof along the circumferential direction. The rack 37 is fixed to the upper surface 17*a* of the upper unit 17. The rack 37 is provided at each of the four corners 10*a* on the upper surface 17*a* of the upper unit 17, and is provided having an arc shape (sectorial shape) centered on the turning axis AX2 of the traveling wheel 21. The rack 37 includes a plurality of teeth which mesh with the teeth of the pinion gear 36, on the outer circumference thereof along the circumferential direction.

The pinion gear 36 and the rack 37 are arranged in the state where the teeth of the pinion gear 36 and the teeth of the rack 37 are in mesh with each other. As the pinion gear 36 rotates in the θZ direction, the pinion gear 36 moves in the circumferential direction around the turning axis AX2 along the outer circumference of the rack 37. As a result of this movement of the pinion gear 36, the connection member 32 turns, and the traveling driver 33 and the direction changer 34 turn together with the pinion gear 36 in the circumferential direction and around the turning axis AX2.

As a result of the turning of the direction changer 34, the traveling wheel 21 and the auxiliary wheels 22 arranged in each of the four corners 10*a* on the upper surface 17*a* all turn in the θZ direction around the turning axis AX2 within a range of 90 degrees. The driving of the direction changer 34 is controlled by the controller 50. The controller 50 may instruct the four traveling wheels 21 to perform the turning operation at the same time, or may instruct them to perform the turning operations at different times. By causing the traveling wheel 21 and the auxiliary wheels 22 to turn, the traveling wheel 21 shifts from the state of being in contact with one of the first track R1 and the second track R2 to the state of being in contact with the other. In other words, the traveling wheel 21 shifts from the state where the direction of the rotation axis of the traveling wheel 21 is one of the first direction D1 and the second direction D2 to the state where direction of the rotation axis of the traveling wheel 21 is the other. As a result, it is possible to switch between the first state where the traveling direction of the traveling vehicle 100 is the first direction D1 (X direction) and the second state where the traveling direction is the second direction D2 (Y direction).

Figure 6:
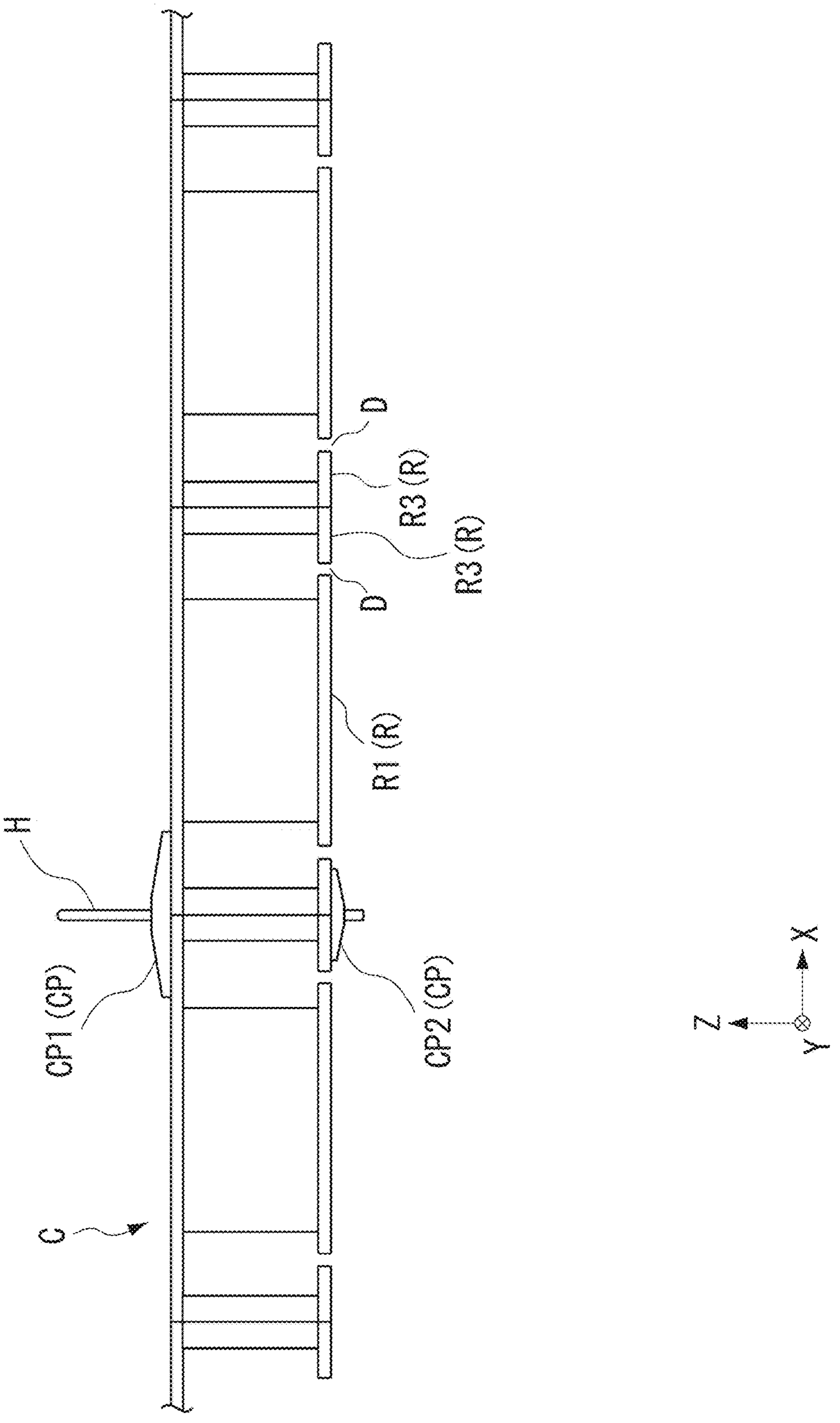
FIG. 6 is a diagram for describing an example of coupling members according to a preferred embodiment of the present invention.

FIG. 6 to FIG. 9 are diagrams for describing an example of coupling members according to the present preferred embodiment. In the present preferred embodiment, the coupling member CP arranged on the upper side (+Z side) will be described as a coupling member CP1 and the coupling member CP arranged on the lower side (−Z side) as a coupling member CP2, however, they will be referred to as coupling members CP when not distinguished from one another. FIG. 6 is a side view of the coupling members CP that link a plurality of unitary units U (grid-patterned track R). As shown in FIG. 6, the coupling member CP1 is provided above the connection C so as to be able to link a plurality of unitary units U. Specifically, one coupling member CP1 can link four unitary units U by linking four connections C. The coupling member CP2 is provided below the intersection track R3 so as to be able to link a plurality of unitary units U. Specifically, one coupling member CP2 can link four unitary units U by each linking four intersection tracks R3 of different unitary units U. The suspender H penetrates through the center portion of the coupling member CP. As a result, the grid-patterned track R is suspended from the ceiling.

Figure 7:
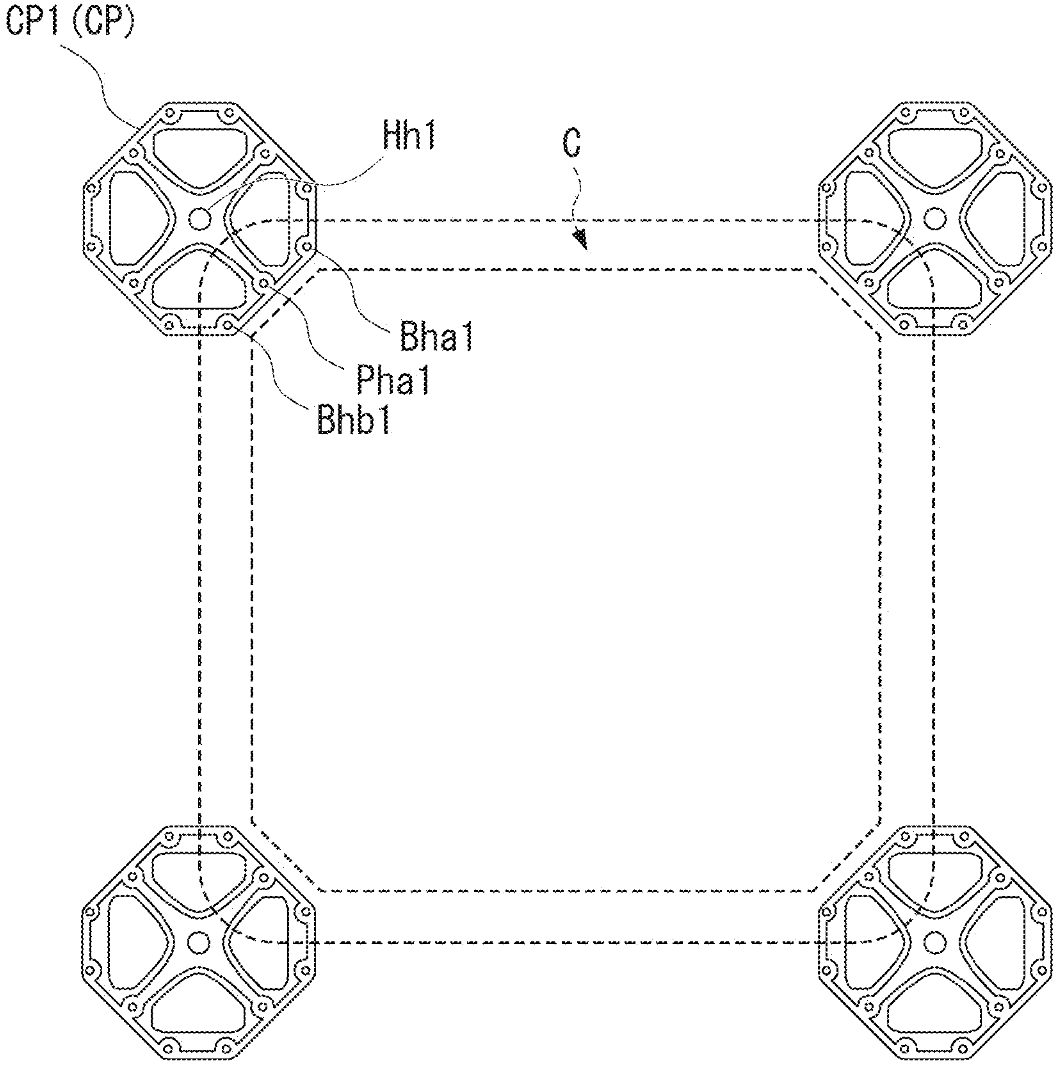
FIG. 7 is a diagram for describing an example of coupling members according to a preferred embodiment of the present invention.
Figure 8:
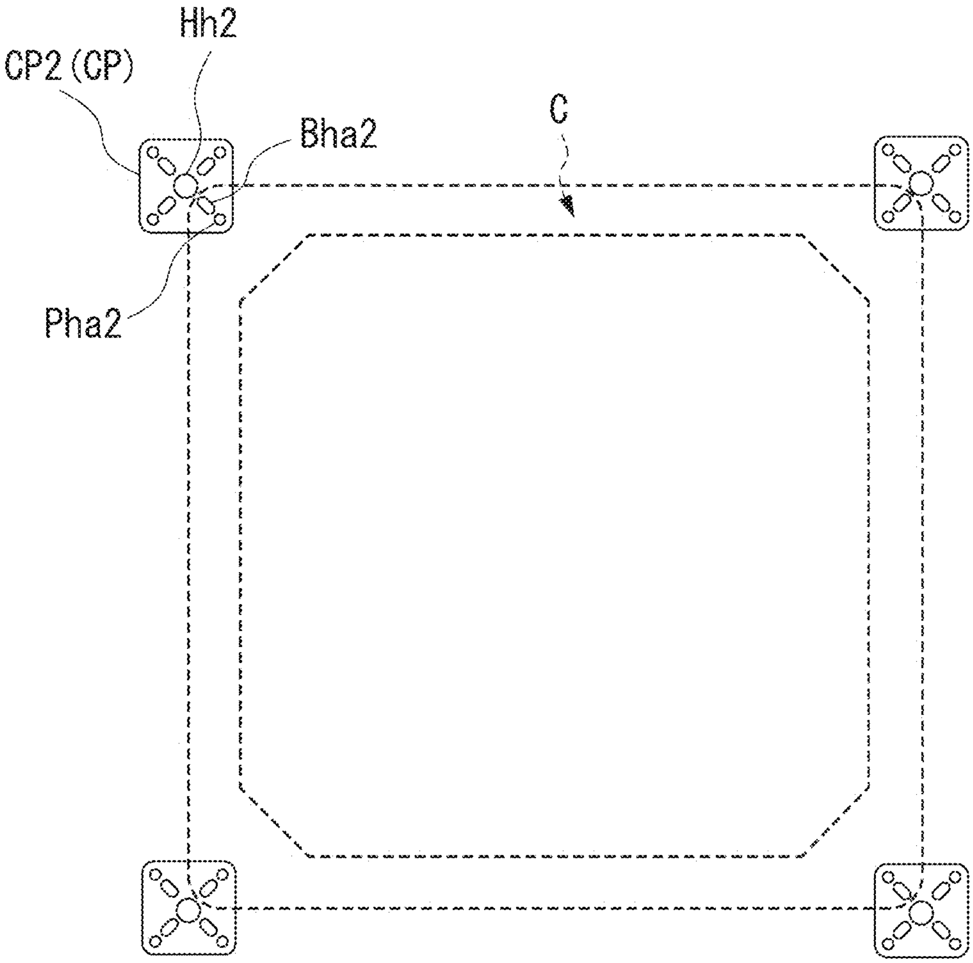
FIG. 8 is a diagram for describing an example of coupling members according to a preferred embodiment of the present invention.

FIG. 7 is a plan view of the coupling member CP1. FIG. 8 is a plan view of the coupling member CP2. In FIG. 7 and FIG. 8, the connection C of the unitary unit U is denoted by dashed lines. As shown in FIG. 7, the coupling member CP1 has a suspender hole Hh1 through which the suspender H passes, pin holes Pha1 through each of which a pin is inserted into the connection C, and bolt holes Bha1, Bhb1 for fixing the coupling member CP1 and the connection C using members such as bolts. The hole Pha1, the hole Bha1, and the hole Bhb1 are each arranged at four positions in one coupling member CP1. The four coupling members CP1 shown in FIG. 7 all have the same configuration. The shape and so forth of the coupling member CP1 are only an example, and may not be formed as illustrated. As shown in FIG. 8, the coupling member CP2 has a suspender hole Hh2 through which the suspender H passes, pin holes Pha2 through each of which a pin is inserted into the intersection track R3, and bolt holes Bha2 to fix the coupling member CP2 and the intersection track R3 (and also the connection C) using members such as bolts. The hole Pha2 and the hole Bha2 are each arranged at four positions in one coupling member CP2. The four coupling members CP2 shown in FIG. 8 all have the same configuration. The shape and so forth of the coupling member CP2 are only an example, and may not be formed as illustrated.

Figure 9:
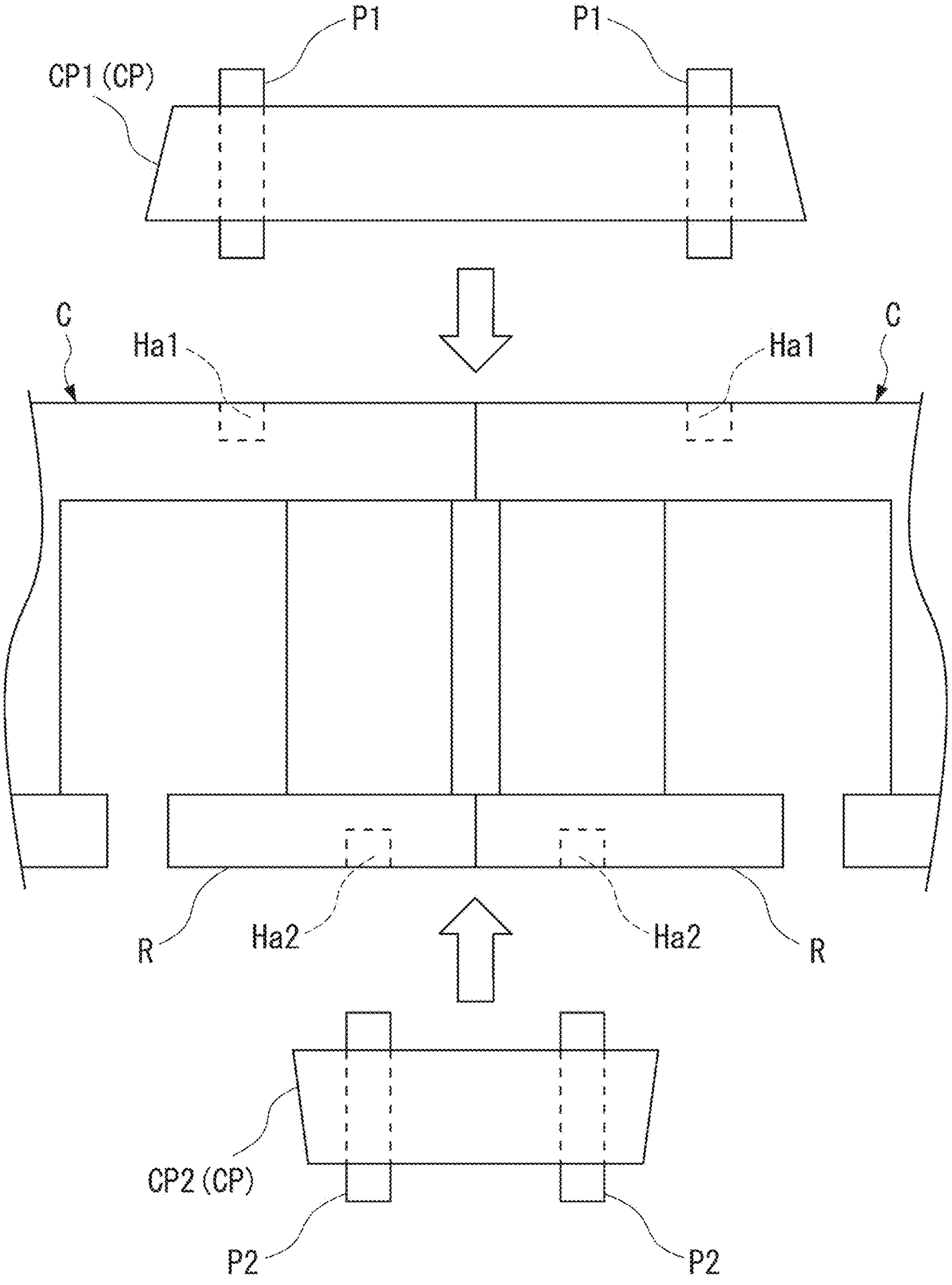
FIG. 9 is a diagram for describing an example of coupling members according to a preferred embodiment of the present invention.

FIG. 9 is a side view showing an example of inserting pins through the coupling member CP. As shown in FIG. 9, a pin P1 that is inserted through the connection C via the coupling member CP1 is fitted into a blind hole Ha1 (a hole having a closed end) formed in the connection C. A pin P2 that is inserted through the track R (intersection track R3) via the coupling member CP2 is fitted into a blind hole Ha2 formed in the track R. When the pins P1, P2 are arranged at different positions in the vertical direction (Z direction) between the coupling member CP1 and the coupling member CP2, the unitary unit U does not rotate around the pins P1, P2, and the center of the coupling members CP1, CP2 is the center of the rotation of the unitary unit U. Unlike FIG. 9, for example, the pins P1, P2 may be arranged at the same position in the vertical direction (Z direction) between the coupling member CP1 and the coupling member CP2. When the pins P1, P2 are arranged at the same positions in the vertical direction (Z direction), the unitary unit U can rotate around the pins P1, P2. Thus, the positions of the pins P1, P2 may be arranged in either of the positioning manners mentioned above.

Figure 10A:
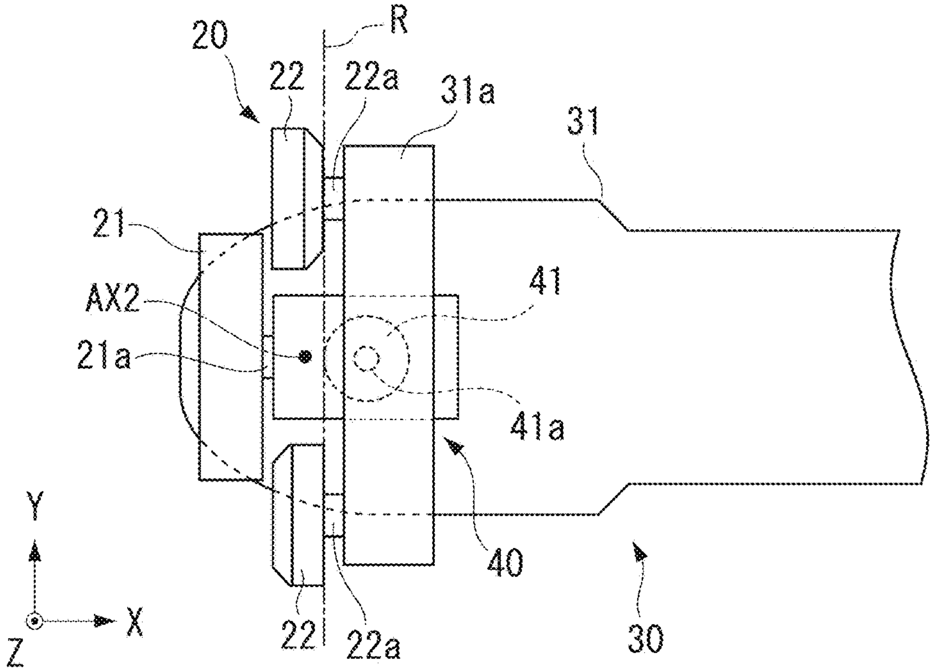
FIGS. 10A and 10B are diagrams showing an example of a traveler and a coupler according to a preferred embodiment of the present invention.
Figure 10B:
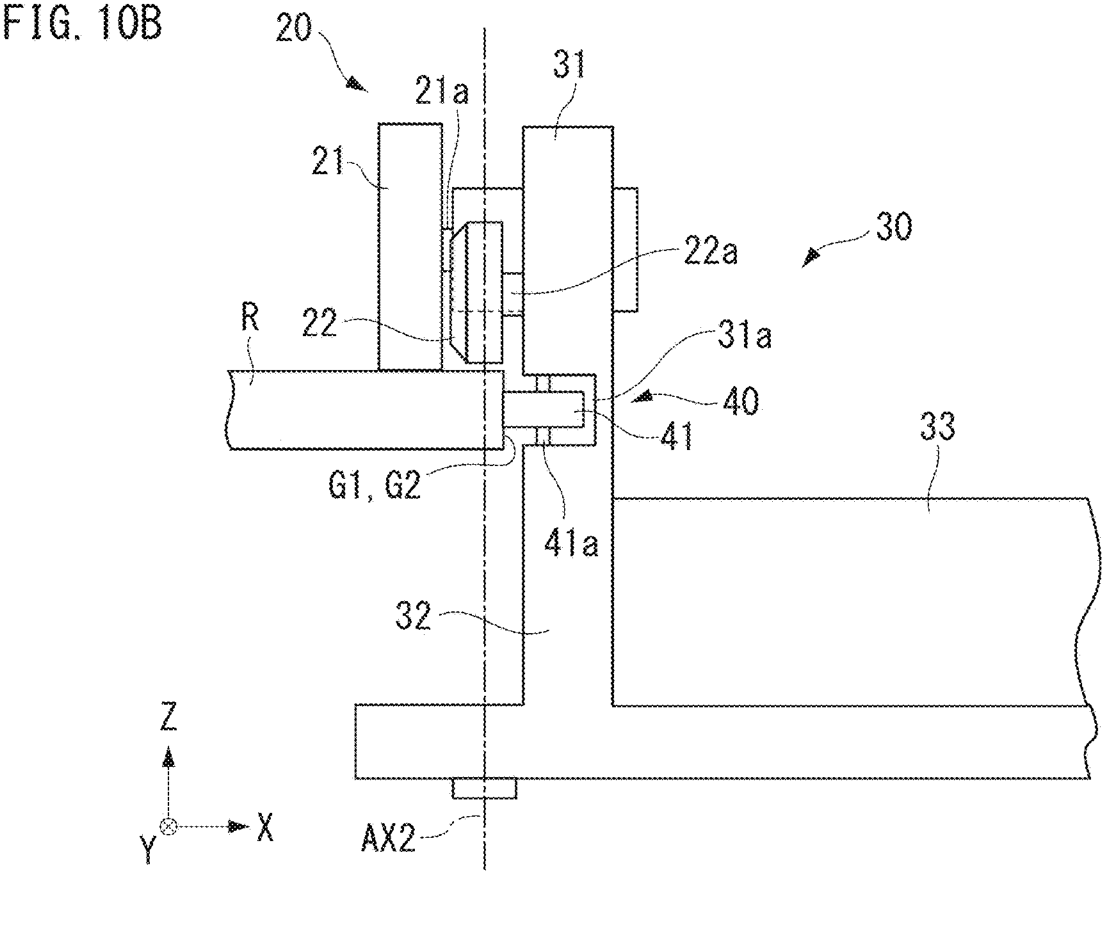

FIGS. 10A and 10B are diagrams showing an example of the traveler and the coupler according to the present preferred embodiment. FIG. 10A is a plan view, and FIG. 10B is a front elevation view. As shown in FIGS. 10A and 10B, a guide accommodation 31*a* is provided in the support member 31 of the coupler 30. The guide 40 reduces or prevents the positional deviation of the coupler 30 with respect to the grid-patterned track R, thus suppressing the positional deviation of the main body 10 with respect to the grid-patterned track R. The guide 40 is provided in each coupler 30 arranged at each of the four corners 10*a* of the upper surface 17*a* of the main body 10 (see FIG. 1 and FIG. 2). In a first state where the traveling wheel 21 is traveling on the first track R1, the guide 40 moves along the first guide surface G1 and the first connection guide surface G3*a*. In a second state where the traveling wheel 21 is traveling on the second track R2, the guide 40 moves along the second guide surface G2 and the second connection guide surface G3*b*. In the state where the main body 10 is traveling, the guide 40 may be in contact with the first guide surface G1 or the second guide surface G2, or may be spaced apart from the first guide surface G1 or the second guide surface G2.

The guide 40 includes a guide roller 41 accommodated in the guide accommodation 31*a* of the support member 31. The guide roller 41 is accommodated in the guide accommodation 31*a*, and is arranged in a state where the end part thereof on the −X side projects from the guide accommodation 31*a*. The guide roller 41 is supported by a roller axle 41*a* so as to be able to rotate around the Z axis. The roller axle 41*a* is fixed inside the guide accommodation 31*a* and arranged parallel to the Z direction.

The roller axle 41*a* may be supported by an elastic member, for example. With such a configuration, the guide roller 41 is supported so as to be movable in the X direction and rotatable, and the impact of the guide roller 41 hitting the first guide surface G1 or the like can be absorbed by the elastic member. The guide roller 41 is a driven roller that does not have a drive source for rotating the guide roller 41. However, a driver that rotates the guide roller 41 in accordance with the traveling direction of the main body 10 may be provided.

The guide roller 41 is arranged at a height position between the axle 21*a* of the traveling wheel 21 and the main body 10. The first guide surface G1 and the second guide surface G2 are arranged at a height position between the axle 21*a* of the traveling wheel 21 and the body portion 10. In the coupler 30, the guide roller 41 is arranged at a position corresponding to the height of the first guide surface G1 and the second guide surface G2. The guide roller 41 is arranged at a height position between the axle 21*a* of the traveling wheel 21 and the main body 10 such that an increase in the vertical dimension of the coupler 30 or the traveler 20 is reduced or prevented, and a reduction in the space efficiency in the vicinity of the ceiling of the building is prevented.

Since the roller axle 41*a* is provided in the coupler 30, when the direction changer 34 changes the orientation of the traveling wheel 21, that is, when the direction changer 34 causes the coupler 30 to turn, the guide 40 (guide roller 41) turns around the turning axis AX2 as the traveling wheel 21 turns. Therefore, in the first state where the traveling wheel 21 is traveling on the first track R1, the guide roller 41 opposes the first guide surface G1 and the first connection guide surface G3*a*. In the second state where the traveling wheel 21 is traveling on the second track R2, the guide roller 41 opposes the second guide surface G2 and the second connection guide surface G3*b*. Thus, the guide roller 41 is turned using the direction changer 34 in order to switch the traveling state of the traveling wheel 21, and therefore, no separate mechanism is needed for turning the guide roller 41, and any complication in the configuration of the main body 10 can be prevented.

Figure 11:
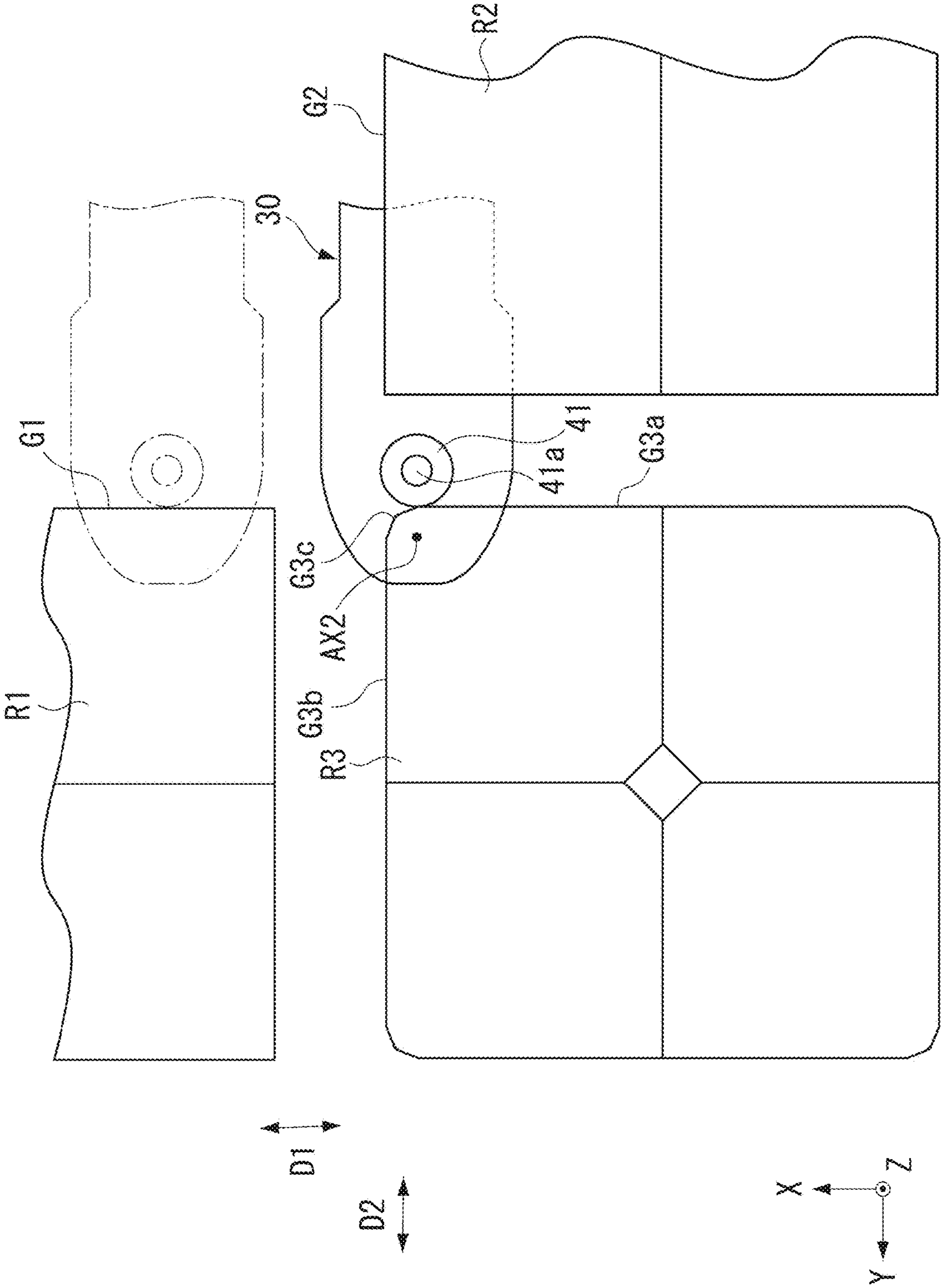
FIG. 11 is a plan view showing an example of the positional relationship between a first track, a second track, an intersection track, and a guide roller according to a preferred embodiment of the present invention.
Figure 12:
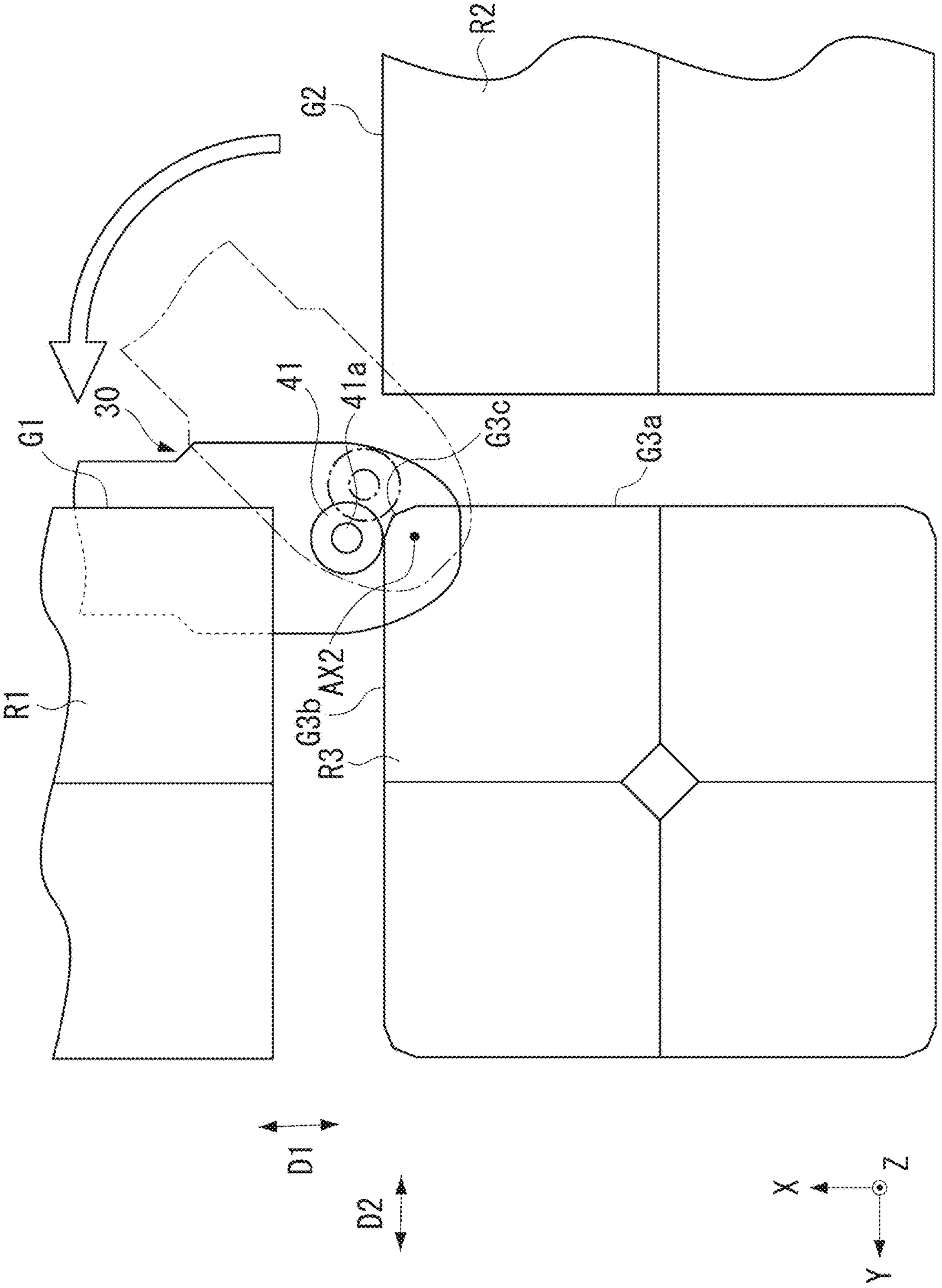
FIG. 12 is a plan view showing an example of a guide (guide roller) when turning a traveling wheel according to a preferred embodiment of the present invention.

FIG. 11 is a plan view showing an example of the positional relationship between the first track, the second track, the intersection track, and the guide roller according to the present preferred embodiment. FIG. 12 is a plan view showing an example of the guide (guide roller) when turning the traveling wheel according to the present preferred embodiment. In FIG. 11 and FIG. 12, the illustration of the guide accommodation 31*a* of the supporter 31 is omitted. As shown in FIG. 11 and FIG. 12, a portion of the guide roller 41 projecting from the guide accommodation 31*a* of the support member 31 can come into contact with the first guide surface G1, which is a side surface of the first track R1, the second guide surface G2, which is a side surface of the second track R2, and the first connection guide surface G3*a* and the second connection guide surface G3*b*, which are side surfaces of the intersection track R3. Here, the guide roller 41 does not come in contact with the non-contact surface G3*c* of the intersection track R3 that is chamfered, for example. The non-contact surface G3*c* may have any shape as long as it does not come in contact the guide roller 41 when the guide roller 41 moves from the first connection guide surface G3*a* to the second connection guide surface G3*b*. The non-contact surface G3*c* is, for example, chamfered to the extent that it does not come in contact with the guide roller 41. For example, FIG. 11 and FIG. 12 show an example in which the non-contact surface G3*c* is of a shape that is two-step chamfered and the step-chamfered surfaces are smoothly continuous.

As shown in FIG. 11, when the main body 10 is traveling in the first direction D1 (when the traveling wheel 21 is in the first state where it is rolling on the first track R1), the guide roller 41 moves along the first guide surface G1 or the first connection guide surface G3*a*. In this first state, the portion of the guide roller 41 projecting from the guide accommodation 31*a* can come into contact with the first guide surface G1 and the first connection guide surface G3*a*. Since the guide roller 41 can rotate while being in contact with the first guide surface G1 and the first connection guide surface G3*a*, frictional resistance at the time of being in contact therewith is reduced while the main body 10 is traveling, and it is possible to reduce or prevent an increase in the load on the traveling driver 33 while also reducing or preventing generation of particles.

When the main body 10 moves in the second direction D2 in the state shown in FIG. 11, the guide roller 41 comes in contact with the first guide surface G1 or the first connection guide surface G3*a*, thereby restricting the positional deviation of the main body 10 in the second direction D2. That is to say, the main body 10 includes a pair of guide rollers 41 along the second direction D2, and the guide rollers 41 come in contact with the first guide surface G1 or the first connection guide surface G3*a* opposing each other, and as a result, the positional deviation of the main body 10 in the +Y direction and the −Y direction is suppressed. Therefore, it is possible to restrict the positional deviation in the second direction D2 not only when the main body 10 is traveling in the first direction D1 but also when the main body 10 is stopped anywhere on the grid-patterned track R.

As shown in FIG. 12, when causing the main body 10 to travel along the second direction D2 (bringing the traveling wheel 21 into the second state of rolling on the second track R2) from the state of traveling in the first direction D1, the direction changer 34 causes the traveling wheel 21 to turn.

At this time, the guide roller 41 turns around the turning axis AX2 as a result of the direction changer 34 causing the coupler 30 to turn. Specifically, the guide roller 41 moves from the first connection guide surface G3*a* to the second connection guide surface G3*b*. At this time, the guide roller 41 moves from the first connection guide surface G3*a* to the second connection guide surface G3*b* without coming into contact with the non-contact surface G3*c*, which is chamfered, for example.

As shown in FIG. 12, as the guide roller 41 moves to the state of being along the second connection guide surface G3*b*, the main body 10 is brought into the state where the main body 10 can travel along the second direction D2 (the second state where the traveling wheel 21 is rolling on the second track R2). In this second state, the portion of the guide roller 41 projecting from the guide accommodation 31*a* can come into contact with the second guide surface G2 and the second connection guide surface G3*b*. Since the guide roller 41 can rotate while being in contact with the second guide surface G2 and the second connection guide surface G3*b*, frictional resistance at the time of being in contact therewith is reduced while the main body 10 is traveling, and it is possible to reduce or prevent an increase in the load on the traveling driver 33.

When the main body 10 moves in the first direction D1 in the state shown in FIG. 12, the guide roller 41 comes in contact with the second guide surface G2 or the second connection guide surface G3*b*, thereby restricting the positional deviation of the main body 10 in the first direction D1. That is to say, the main body 10 includes a pair of guide rollers 41 along the second direction D1, and the guide rollers 41 come in contact with the second guide surface G2 or the second connection guide surface G3*b* opposing each other. As a result, the positional deviation of the main body 10 in the +X direction and the −X direction is reduced or prevented. Therefore, it is possible to restrict the positional deviation in the first direction D1 not only when the main body 10 is traveling in the second direction D2 but also when the main body 10 is stopped anywhere on the grid-patterned track R.

Figure 13:
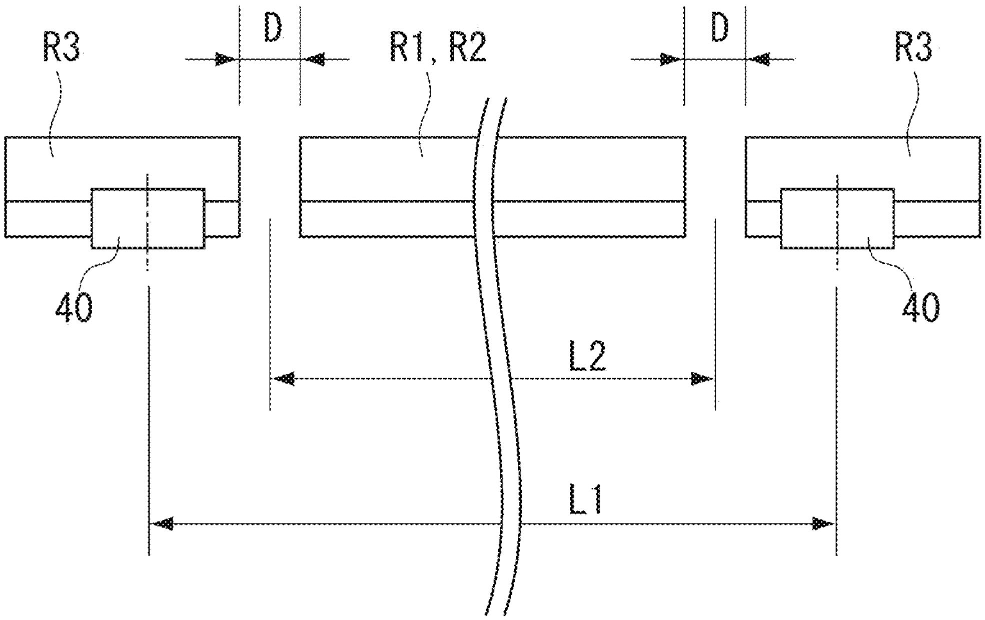
FIG. 13 is a side view showing an example of a positional relationship between guide rollers and a grid-patterned track according to a preferred embodiment of the present invention.

FIG. 13 is a side view showing an example of the positional relationship between the guide rollers and the grid-patterned track according to the present preferred embodiment. As shown in FIG. 13, a space L1 between two of the four guide rollers 41 aligned in the traveling direction is set to be different from a space L2 between the gaps D adjacent in the first direction D1 or the second direction D2. With such a configuration, it is possible to prevent the two guide rollers 41 aligned in the traveling direction from being positioned in the gaps D at the same time. In the example shown in FIG. 13, the space L1 between the guide rollers 41 is greater than the space L2 between the gaps D. However, the present invention is not limited to this example, and the space L1 between the guide rollers 41 may be smaller than the space L2 between the gaps D.

Figure 14:
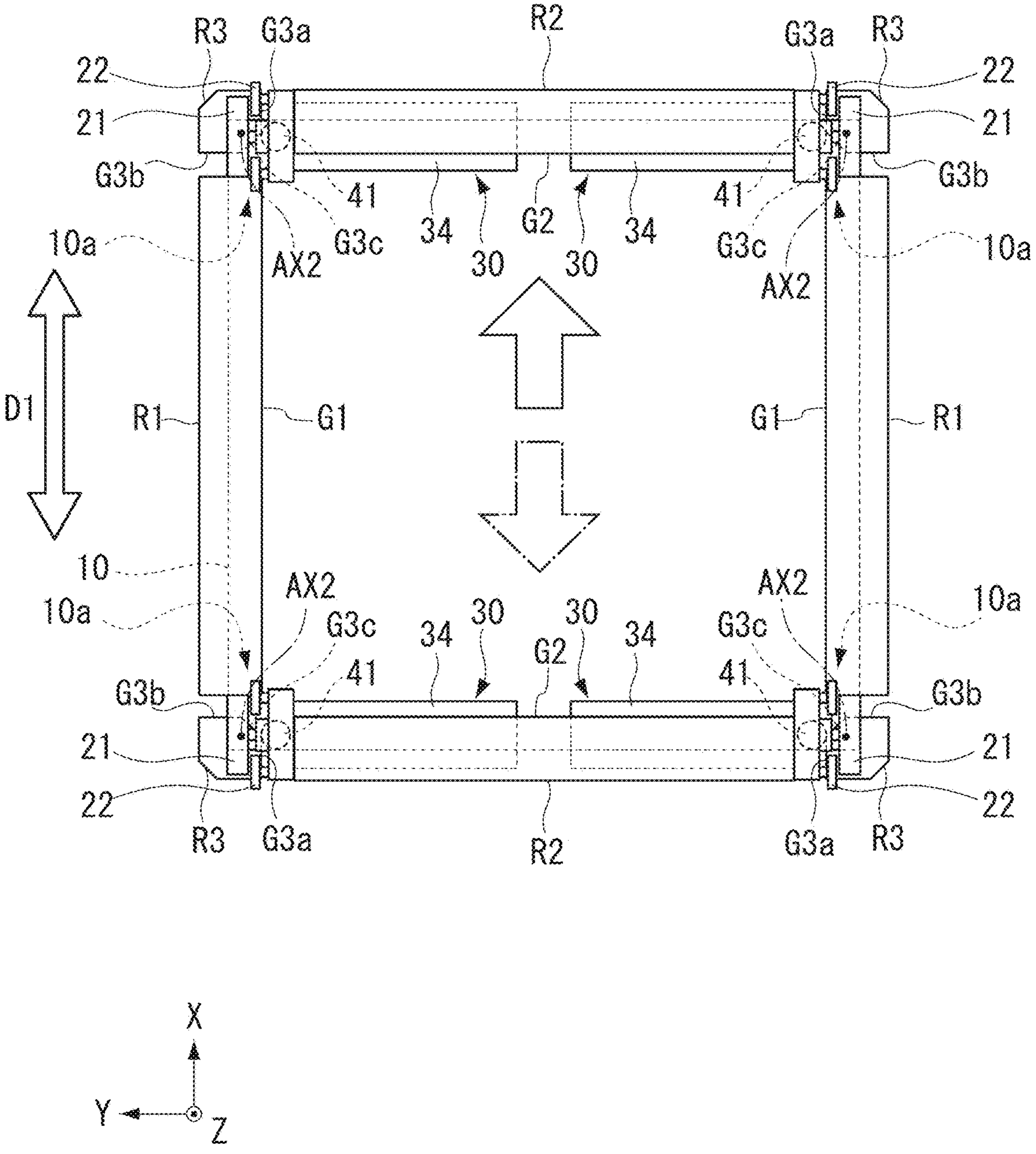
FIG. 14 is a diagram showing an example of an operation in which a traveling vehicle according to a preferred embodiment of the present invention changes the traveling direction thereof from a first direction to a second direction.

Next, a case where the traveling vehicle 100 changes its traveling direction in the traveling vehicle system SYS according to the present preferred embodiment will be described. FIG. 14 to FIG. 17 are diagrams showing an example of an operation in which the traveling vehicle according to the present preferred embodiment changes the traveling direction thereof from the first direction to the second direction. As shown in FIG. 14, the traveling vehicle 100 stops at a position where the main body 10 of the traveling vehicle 100 traveling in the first direction D1 (+X direction or −X direction) on the first track R1 reaches one of the unitary units U of the grid-patterned track R (where the four corners 10*a* are reaching the intersection tracks R3). That is to say, the controller 50 stops driving the traveling driver 33 at the position mentioned above. At this time, the four traveling wheels 21 are all in contact with the intersection tracks R3. The four guide rollers 41 are each arranged at a position along the first connection guide surface G3*a* of the intersection track R3.

Figure 15:
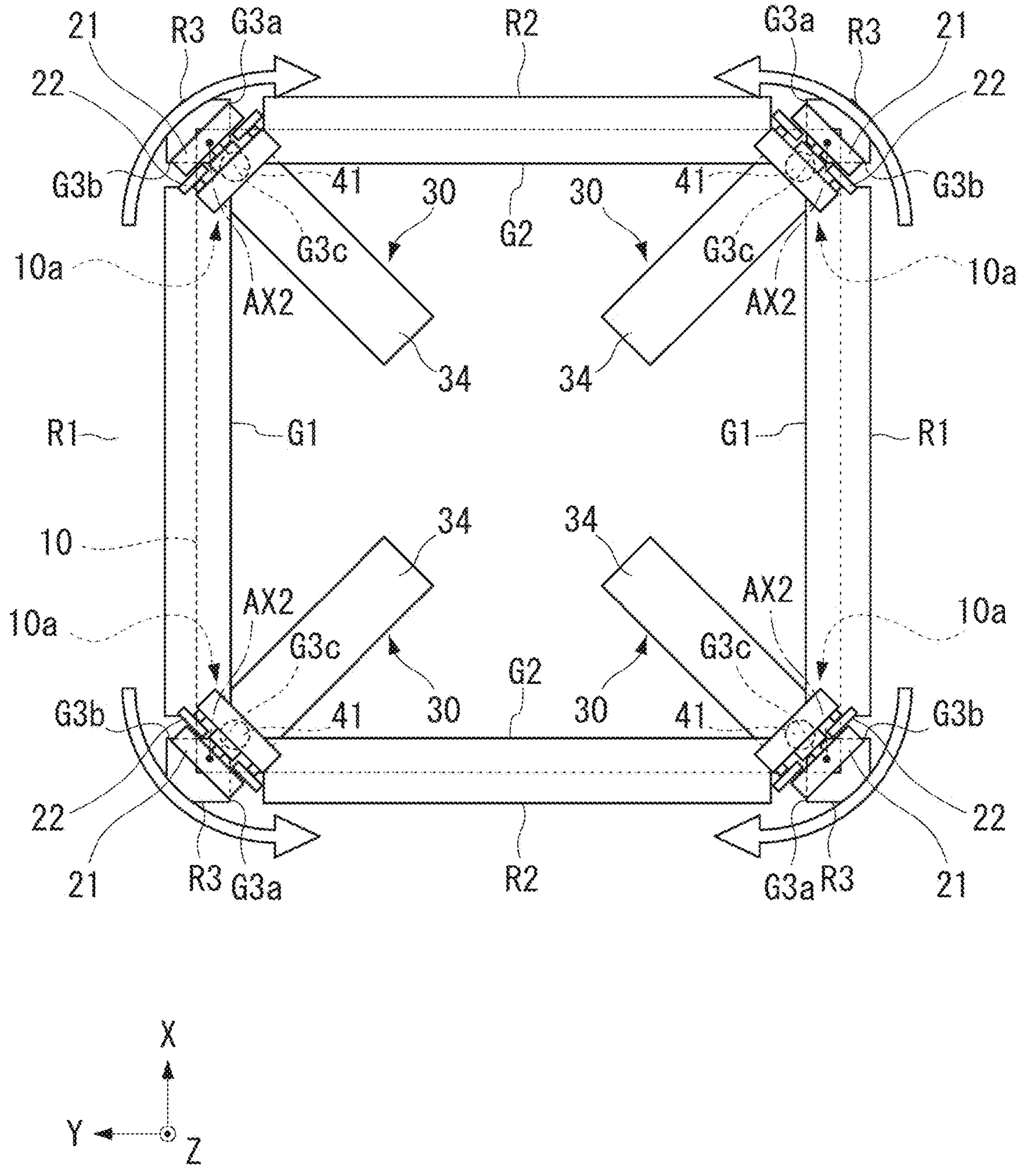
FIG. 15 is a diagram showing an example of an operation in which a traveling vehicle according to a preferred embodiment of the present invention changes the traveling direction thereof from a first direction to a second direction.

As shown in FIG. 15, the controller 50 drives the direction changers 34 to cause the couplers 30 to turn, and causes the traveling wheels 21 and the auxiliary wheels 22 positioned at the four corners 10*a* to each turn in the OZ direction around the turning axis AX2. At this time, the traveling wheels 21 and so forth positioned diagonally opposed to each other turn in the same direction. For example, of the four traveling wheels 21, in the figure, the traveling wheel 21 and so forth at the upper left and the traveling wheel 21 and so forth at the lower right turn in the clockwise direction. On the other hand, in the figure, the traveling wheel 21 and so forth at the upper right and the traveling wheel 21 and so forth at the lower left turn in the counter-clockwise direction. Such turning operations may be performed at the same time or at different times. For example, the traveling wheels 21 and so forth at the upper left and the lower right in the figure may be simultaneously turned first, and then, the traveling wheels 21 and so forth at the upper right and the lower left in the figure may be turned at the same time.

When the traveling wheels 21 and the auxiliary wheels 22 turn, the four guide rollers 41 together with the couplers 30 each turn around the turning axis AX2 and move without coming in contact with the non-contact surface G3*c*. Since the turning of the traveling wheels 21 and so forth and the turning of the guide rollers 41 are performed by the direction changers 34, no separate configuration for changing the direction of the guide rollers 41 is needed, and complication in the configuration of the main body 10 is avoided.

Figure 16:
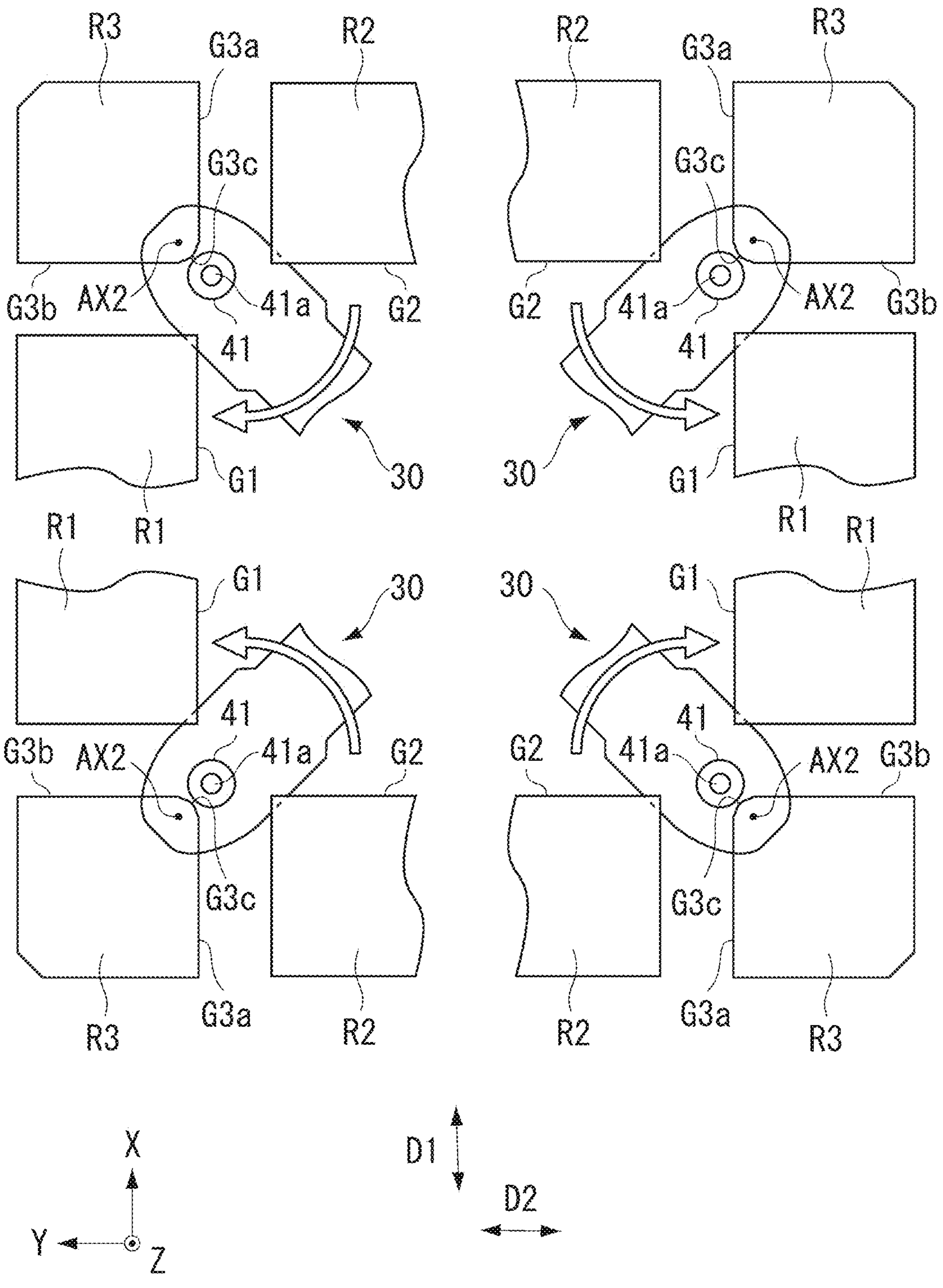
FIG. 16 is a diagram showing an example of an operation in which a traveling vehicle according to a preferred embodiment of the present invention changes the traveling direction thereof from the first direction to the second direction.

FIG. 16 is a plan view showing an example of the guide rollers when turning according to the present preferred embodiment is performed. As shown in FIG. 16, the turning operation of the four traveling wheels 21 are performed at the same time, and the four guide rollers 41 provided in the couplers 30 thereby change their orientations in synchronization. As a result of the main body 10 being configured in a manner such that each of the guide rollers 41 does not come in contact with the intersection track R3 (non-contact surface G3*c*) when the traveling wheels 21 turn (when they are steered), the impact during turning can be reduced compared to the case of providing a draw-in shape intended for the guide roller to come in contact with the intersection track. In other words, the main body 10 is configured such that the guide rollers 41 do not come into contact with the intersection tracks R3 (non-contact surface G3*c*) when turning is performed, and therefore, compared to the case of providing a draw-in shape intended for the guide roller 41 to come in contact with the intersection track R3 (non-contact surface G3*c*), it is possible to mitigate the impact caused by drawing-in and reduce or prevent the positional deviation caused by the impact.

Figure 17:
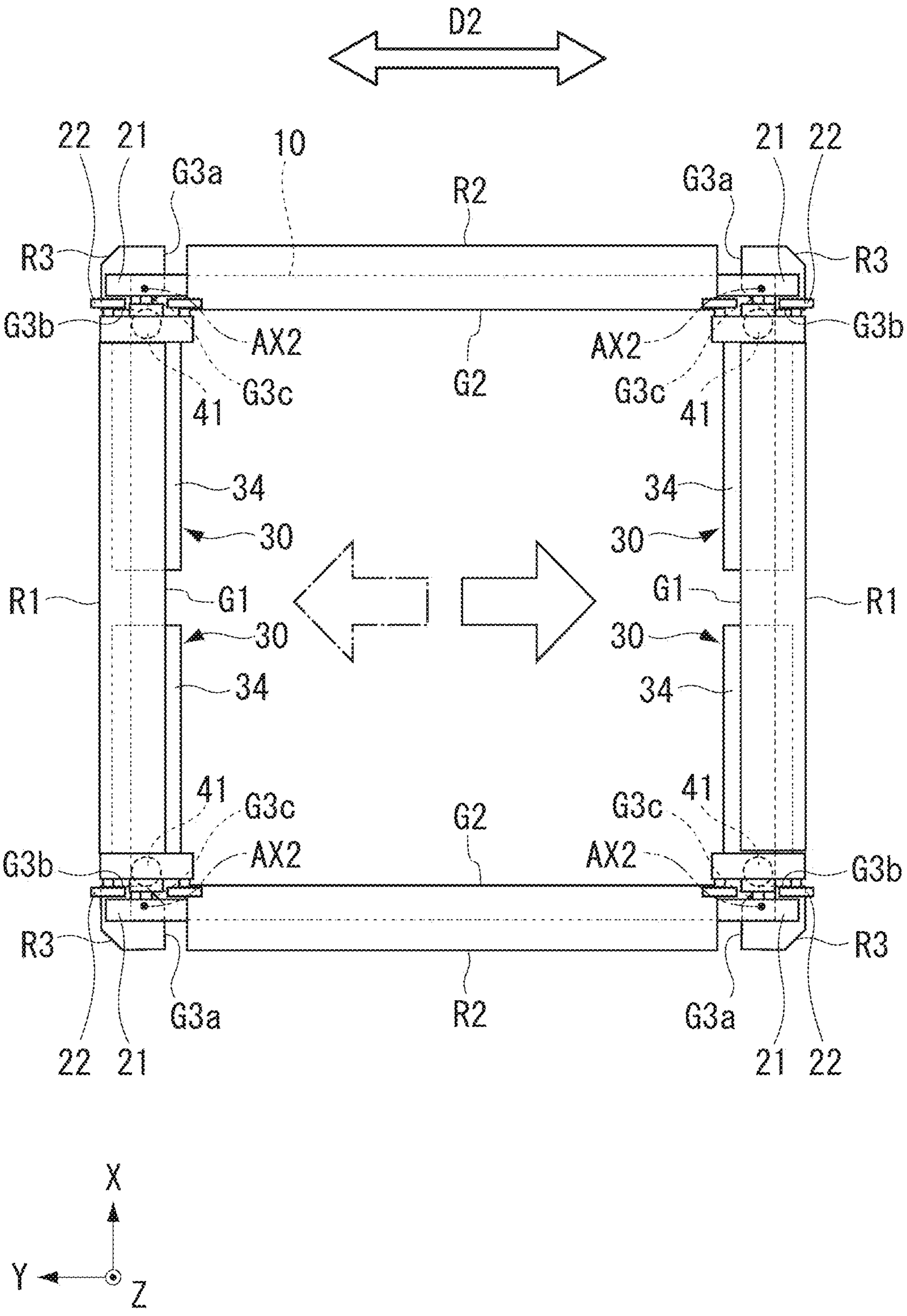
FIG. 17 is a diagram showing an example of an operation in which a traveling vehicle according to a preferred embodiment of the present invention changes the traveling direction thereof from the first direction to the second direction.

As shown in FIG. 17, after each traveling wheel 21 and so forth have turned 90 degrees in the OZ direction, the controller 50 stops driving the direction changers 34. By driving the traveling drivers 33 in this state, the traveling vehicle 100 can travel in the second direction D2 (+Y direction or −Y direction). The four guide rollers 41 are each positioned at a position along the second connection guide surface G3*b* of the intersection track R3. It should be noted that the main body 10 does not turn even when the traveling wheels 21 and so forth turn. Therefore, in both of the case where the traveling vehicle 100 is traveling in the first direction D1 and the case where the traveling vehicle 100 is traveling in the second direction D2, the orientation of the main body 10 stays unchanged.

Figure 18A:
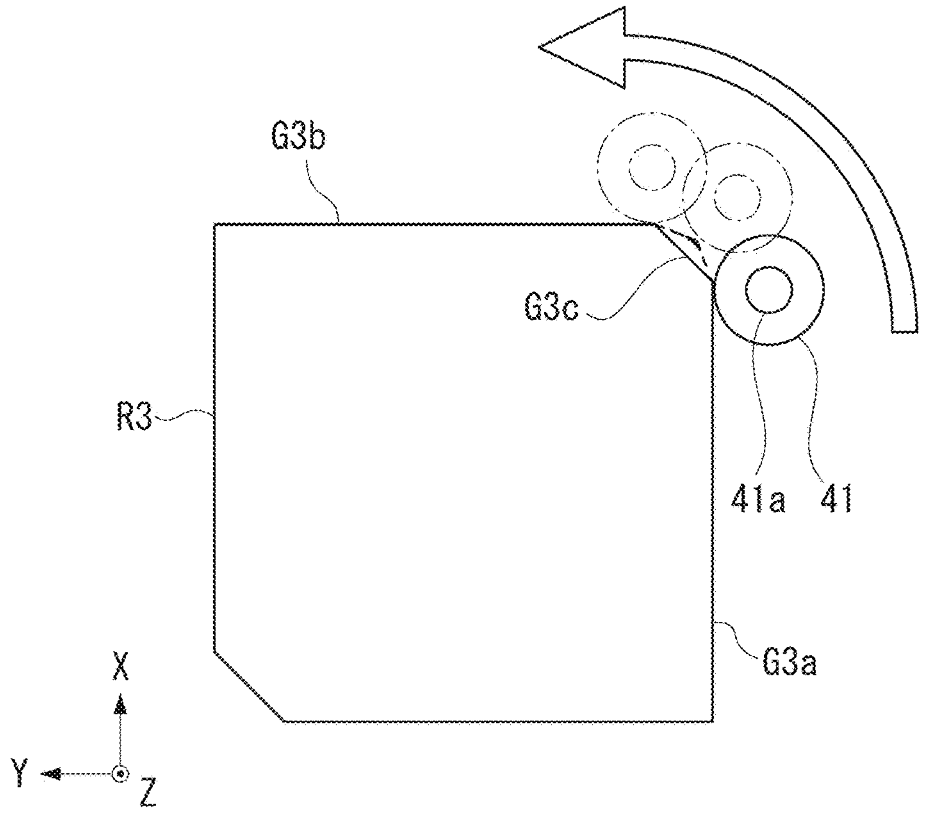
FIGS. 18A and 18B are diagrams showing another example of a non-contact surface according to a preferred embodiment of the present invention.
Figure 18B:
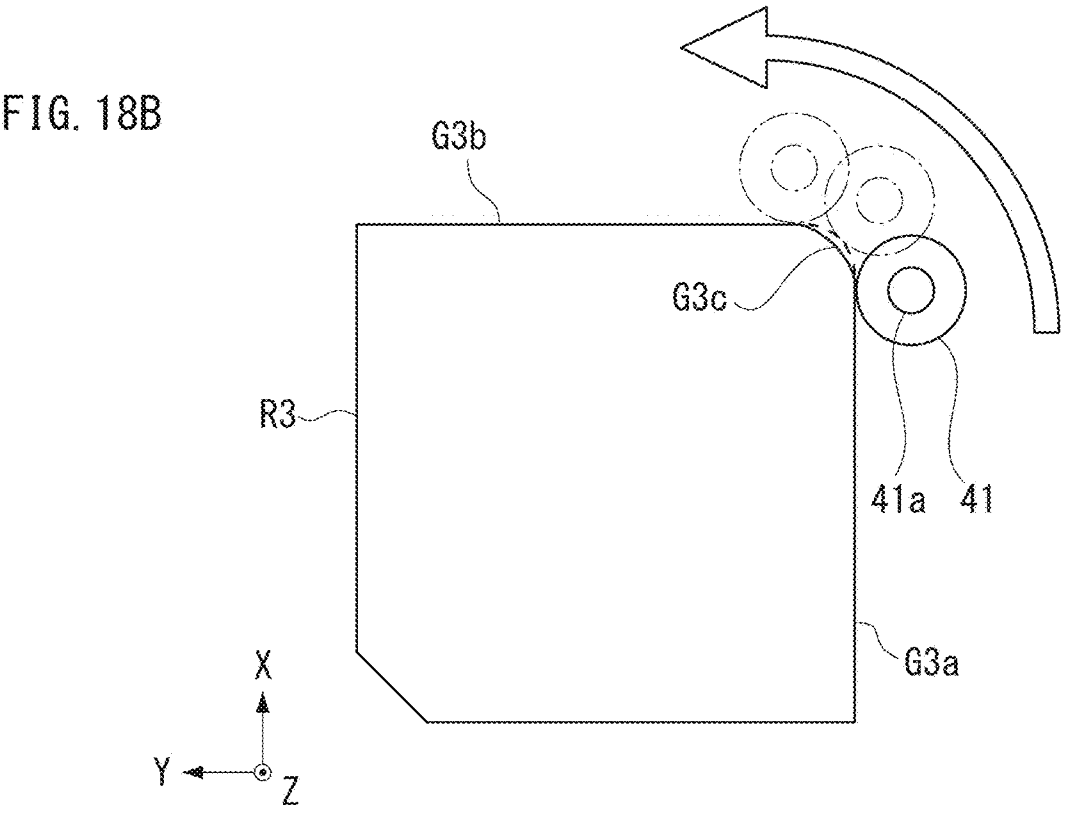

FIGS. 18A and 18B are diagrams showing another example of the non-contact surface according to the present preferred embodiment. As shown in FIG. 18A, the non-contact surface G3*c* of the intersection track R3 may be one-step chamfered that differs from the two-step chamfering mentioned above. In FIG. 18A, the two-step chamfering mentioned above is represented by a dashed line. The non-contact surface G3*c*, which is one-step chamfered, does not come in contact with the guide roller 41 during turning, as in the example described above. As shown in FIG. 18B, the non-contact surface G3*c* of the intersection track R3 may be entirely curved. At this time, the non-contact surface G3*c* does not come in contact with the guide roller 41 during turning, as in the example described above. In FIG. 18B, the continuous surface that comes in contact with the guide roller 41 during turning is represented by a dashed line. the shape of the non-contact surface G3*c* only needs to be a shape that does not come in contact with the guide roller 41 when the guide roller 41 turns. However, since the auxiliary wheels 22 come into contact with the traveling surfaces R1*a*, R2*a*, and R3*a* to prevent the traveling wheel 21 from falling, it is preferred that the non-contact surface G3*c* be chamfered or curved to a degree that prevents the traveling wheel 21 from falling.

Figure 19A:
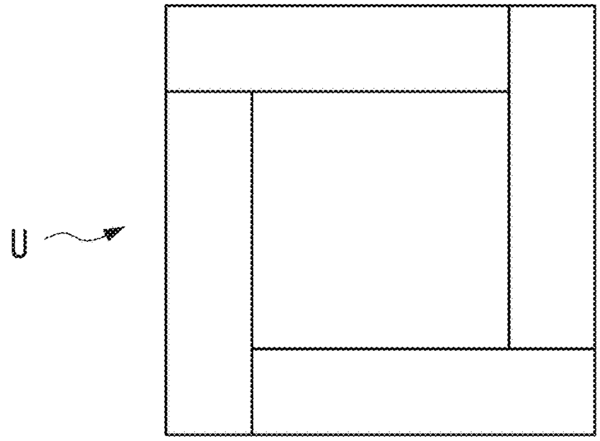
FIGS. 19A to 19C are diagrams showing configuration examples of a unitary unit according to a preferred embodiment of the present invention.
Figure 19B:
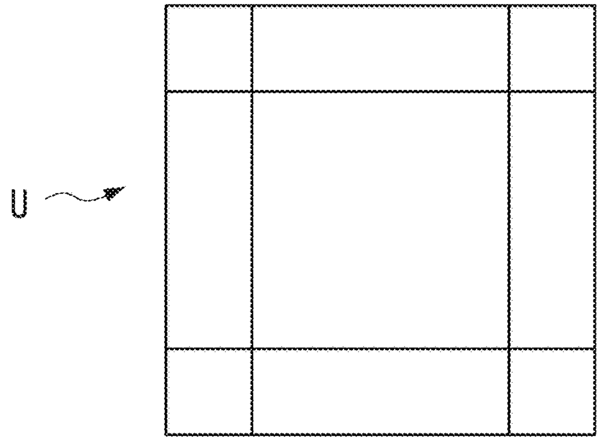
Figure 19C:
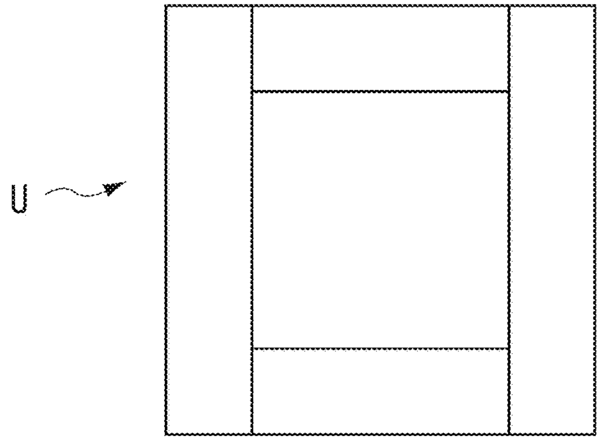

FIGS. 19A to 19C are diagrams showing configuration examples of the unitary unit according to the present preferred embodiment. As shown in FIGS. 19A to 19C, the unitary unit U (the upper portion of the unitary unit U, the connection C) is configured with several members. Each of these members is directly linked by bolts or the like. For example, as shown in FIG. 19A, the unitary unit U (the upper portion of the unitary unit U, the connection C) may be configured by a combination of a member including one of first tracks R1 and one intersection track R3, a member including the other of first tracks R1 and one intersection track R3, a member including one of second tracks R2 and one intersection track R3, and a member including the other of second tracks R2 and one intersection track R3. For example, as shown in FIG. 19B, the unitary unit U (the upper portion of the unitary unit U, the connection C) may be configured by a combination of a member including one of first tracks R1, a member including the other of first tracks R1, a member including one of second tracks R2, a member including the other of second tracks R2, and four members each including one intersection track R3. For example, as shown in FIG. 19C, the unitary unit U (the upper portion of the unitary unit U, the connection C) may be configured by a combination of a member including one of first tracks R1, a member including the other of first tracks R1, a member including one of second tracks R2 and two intersection tracks R3, and a member including the other of second tracks R2 and two intersection tracks R3. FIGS. 19A to 19C are only examples, and the unitary unit U may be configured with any number of members.

As described above, according to the traveling vehicle system SYS of the present preferred embodiment, the grid-patterned track R is formed by linking a plurality of unitary units U where one unitary unit U serves as one cell of the grid-patterned track R, and therefore, it is easier to make the grid shape uniform, and installation of the suspended track is easier without the need for adjusting the installation position on the ceiling. The first tracks R1 and the second tracks R2 are in contact with each other between two adjacent unitary units U, and accordingly, the unitary units U are in contact with each other on the track (not on a point thereof but on a line or plane thereof). Therefore, the positional relationship between the adjacent unitary units U can be easily determined, and the influence on vibration that occurs when the traveling vehicle 100 travels on the grid-patterned track R can be reduced. The coupling members CP that link a unitary unit U to another at a position above or below each of the four intersection tracks R3 is provided, and therefore, by linking more unitary units U (four unitary units U) using a fewer number of coupling members CP, it is possible to achieve highly accurate positioning between the unitary units U, and linking can be performed easily as a result of the reduction in the time and effort required for linking. Since the guide surface of each of the four intersection tracks R3 includes the non-contact surface G3*c* that does not come in contact with the guide roller 41 during turning, it is possible to mitigate the impact caused by the guide roller 41 being drawn in when the guide roller 41 turns, and to reduce or prevent the positional deviation of the traveling vehicle 100 caused by the impact.

Preferred embodiments of the present invention have been described above. However, the technical scope of the present invention is not limited to the description of the above preferred embodiments. It is apparent to those skilled in the art that various modifications or improvements can be added to the above preferred embodiments. The technical scope of the present invention also encompasses one or more of such modifications or improvements. One or more of the requirements described in the above preferred embodiments may be omitted some cases. Furthermore, one or more of the requirements described in the above preferred embodiments may be combined where appropriate. The contents of all documents cited in the detailed description of the present invention are incorporated herein by reference to the extent permitted by law. For example, the shape of the grid-patterned track R may not only be square, but also rectangular or parallelogram. Furthermore, the guide rollers 41 may not be included.

It should be noted that the technical scope of the present invention is not limited to the above-described preferred embodiments. One or more of the requirements described in the above preferred embodiments may be omitted in some cases. One or more of the requirements described in the above preferred embodiments may be combined where appropriate. The contents of Japanese Patent Application No. 2021-093833 and all documents cited in the detailed description of the present invention are incorporated herein by reference to the extent permitted by law.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A traveling vehicle system comprising:

a grid-patterned track of a suspended type; and a traveling vehicle to travel on the grid-patterned track; wherein the grid-patterned track includes a unitary unit corresponding to one cell of a grid;

the unitary unit includes:

two first tracks extending along a first direction, two second tracks extending along a second direction, which is different from the first direction, four intersection tracks corresponding to intersections between extension lines of the two first tracks in the first direction and extension lines of the two second tracks in the second direction, and spaced apart from each of the two first tracks and each of the two second tracks, and a connection that connects each of the four intersection tracks with each of the two first tracks and each of the two second tracks; and the grid-patterned track includes a plurality of the unitary units linked together, and two of the four intersection tracks are continuous between two of the unitary units linked to each other.

2. The traveling vehicle system according to claim 1, wherein the grid-patterned track includes a structure such that:

one of two second tracks and one of another two second tracks are in contact with each other, between two of the unitary units linked in the first direction; and one of two first tracks and one of another two first tracks are in contact with each other, between two of the unitary units linked in the second direction.

3. The traveling vehicle system according to claim 1, wherein the unitary unit is linkable to another unitary unit at a position above or below each of the four intersection tracks.

4. The traveling vehicle system according to claim 1, wherein the traveling vehicle includes a travel wheel and a guide wheel;

the unitary unit includes a guide surface to guide the guide wheel on each side surface of each of the two first tracks, each of the two second tracks, and each of the four intersection tracks; and the guide surface of each of the four intersection tracks has a shape that does not come into contact with the guide wheel when the guide wheel turns as the traveling vehicle changes a traveling direction.

5. A unitary unit comprising:

two first tracks extending along a first direction;

two second tracks extending along a second direction, which is different from the first direction;

four intersection tracks corresponding to intersections between extension lines of the two first tracks in the first direction and extension lines of the two second tracks in the second direction, and spaced apart from each of the two first tracks and each of the two second tracks; and a connection that connects each of the four intersection tracks with each of the two first tracks and each of the two second tracks.

6. A grid-patterned track of a suspended type on which a traveling vehicle is able to travel, the grid-patterned track comprising, as one cell of a grid, a unitary unit including:

two first tracks extending along a first direction;

two second tracks extending along a second direction, which is different from the first direction;

four intersection tracks corresponding to intersections between extension lines of the two first tracks in the first direction and extension lines of the two second tracks in the second direction, and spaced apart from each of the two first tracks and each of the two second tracks; and a connection that connects each of the four intersection tracks with each of the two first tracks and each of the two second tracks; and the grid-patterned track includes a plurality of the unitary units linked together;

two of the four intersection tracks are continuous between two of the unitary units linked to each other.

* * * * *